US 8,799,742 B1

(12) United States Patent
Zhang et al.

(10) Patent No.: US 8,799,742 B1
(45) Date of Patent: Aug. 5, 2014

(54) QC-LDPC DECODER WITH LIST-SYNDROME DECODING

(75) Inventors: Yifei Zhang, Milpitas, CA (US); Gregory Burd, San Jose, CA (US)

(73) Assignee: Marvell International Ltd., Hamilton (BM)

( * ) Notice: Subject to any disclaimer, the term of this patent is extended or adjusted under 35 U.S.C. 154(b) by 74 days.

(21) Appl. No.: 13/493,760

(22) Filed: Jun. 11, 2012

Related U.S. Application Data

(63) Continuation-in-part of application No. 13/397,479, filed on Feb. 15, 2012, now Pat. No. 8,301,984, which is a continuation of application No. 12/180,229, filed on Jul. 25, 2008, now Pat. No. 8,127,209.

(60) Provisional application No. 60/952,747, filed on Jul. 30, 2007, provisional application No. 61/601,790, filed on Feb. 22, 2012, provisional application No. 61/606,104, filed on Mar. 2, 2012.

(51) Int. Cl.
*H03M 13/00* (2006.01)
*H03M 13/11* (2006.01)
*H03M 13/03* (2006.01)

(52) U.S. Cl.
CPC ........ *H03M 13/1142* (2013.01); *H03M 13/036* (2013.01); *H03M 13/116* (2013.01)
USPC .......................................... 714/759; 714/780

(58) Field of Classification Search
None
See application file for complete search history.

(56) References Cited

U.S. PATENT DOCUMENTS

| | | | |
|---|---|---|---|
| 3,909,721 A | 9/1975 | Bussgang et al. |
| 4,291,406 A | 9/1981 | Bahl et al. |
| 4,397,022 A | 8/1983 | Weng et al. |
| 4,782,490 A | 11/1988 | Tenengolts |
| 4,849,975 A | 7/1989 | Patel |
| 5,179,560 A | 1/1993 | Yamagishi et al. |
| 5,280,488 A | 1/1994 | Glover et al. |
| 5,420,873 A | 5/1995 | Yamagishi et al. |
| 5,659,557 A | 8/1997 | Glover et al. |

(Continued)

FOREIGN PATENT DOCUMENTS

| | | |
|---|---|---|
| EP | 1 271 835 | 1/2003 |
| EP | 1 501 210 | 1/2005 |
| WO | WO 00/52873 | 9/2000 |
| WO | WO 02/067491 | 8/2002 |

OTHER PUBLICATIONS

U.S. Appl. No. 12/327,627, filed Dec. 3, 2008, Varnica et al.

(Continued)

*Primary Examiner* — Daniel McMahon

(57) ABSTRACT

A QC-LDPC decoding system employing a trapping set look-up table is provided. The entries of the trapping set look-up table may be sorted according to failure frequencies of the trapping sets. The decoder may determine short-cycles associated with dominant trapping sets in order to decode the received codeword. If the iterative decoder of the QC-LDPC decoding system fails to produce a valid codeword, the decoder may compute the syndrome pattern of the processed codeword and search the look-up table for a trapping set class that is responsible for the iterative decoder's failure. If no responsible trapping set is found in the look-up table, the decoder may attempt to decode the received codeword using alternate decoding methods and subsequently determine a trapping set associated with the decoded codeword. If a trapping set is determined, then that trapping set may be added to the look-up table.

20 Claims, 15 Drawing Sheets

(56) References Cited

U.S. PATENT DOCUMENTS

| | | | |
|---|---|---|---|
| 5,680,340 | A | 10/1997 | Glover et al. |
| 5,875,200 | A | 2/1999 | Glover et al. |
| 5,982,294 | A | 11/1999 | Takayama et al. |
| 6,640,327 | B1 | 10/2003 | Hallberg |
| 7,949,931 | B2 | 5/2011 | Lastras-Montano |
| 8,127,209 | B1 | 2/2012 | Zhang et al. |
| 8,321,746 | B2* | 11/2012 | Li et al. .................. 714/752 |
| 2006/0107167 | A1 | 5/2006 | Jeong et al. |
| 2008/0025427 | A1 | 1/2008 | Lee et al. |
| 2008/0025429 | A1 | 1/2008 | Lee et al. |
| 2008/0025443 | A1 | 1/2008 | Lee et al. |
| 2008/0037670 | A1 | 2/2008 | Lee et al. |
| 2008/0063103 | A1 | 3/2008 | Lee et al. |
| 2008/0198941 | A1 | 8/2008 | Song et al. |
| 2009/0106625 | A1* | 4/2009 | Jun et al. .................. 714/758 |
| 2010/0042904 | A1* | 2/2010 | Gunnam .................. 714/780 |
| 2011/0041033 | A1* | 2/2011 | Yedidia et al. .................. 714/752 |
| 2011/0083058 | A1* | 4/2011 | Hu et al. .................. 714/758 |
| 2011/0126075 | A1* | 5/2011 | Gunnam .................. 714/752 |
| 2011/0138253 | A1* | 6/2011 | Gunnam .................. 714/773 |
| 2012/0005552 | A1* | 1/2012 | Gunnam .................. 714/752 |
| 2012/0089888 | A1* | 4/2012 | Li et al. .................. 714/752 |

OTHER PUBLICATIONS 802.16e: IEEE Standard for Local and metropolitan area networks Part 16: Air Interface for Fixed and Mobile Broadband Wireless Access Systems Amendment for Physical and Medium Access Control Layers for Combined Fixed and Mobile Operation in Licensed Bands (Feb. 2006).

Acolatse, Kodzovi et al., "An Alamouti-based Hybrid-ARQ Scheme for MIMO Systems" 14th IST Mobile and Wireless Communications, Dresden (Jun. 2005).

Acolatse, Kodzovi et al., "Space Time Block Coding HARQ scheme for Highly Frequency Selective Channels" 2007 IEEE International Conference on Communications, pp. 4416-4420 (Jun. 24, 2007).

Alamouti, Siavash M. "A Simple Transmit Diversity Technique for Wireless Communications." IEEE Journal on Select Areas in Communications, vol. 16, No. 8 (Oct. 1998).

Cavus, Enver et al., "A Performance Improvement and Error Floor Avoidance Technique for Belief Propagation Decoding of LDPC Codes," 2005 IEEE 16th International Symposium on Personal, Indoor and Mobile Radio Communications, 978-3-8007-2909-8/05, pp. 2386-2390 (Aug. 2005).

Chase, David. "Code Combining—A Maximum-Likelihood Decoding Approach for Combining an Arbitrary Number of Noisy Packets" IEEE Transactions on Communications, vol. Comm-33 No. 5, pp. 385-393 (May 1985).

Chiang, Ping-Hung et al., "Performance of 2IMO Differentially Transmit-Diversity Block Coded OFDM Systems in Doubly Selective Channels" Global Telecommunications Conference, 2005, pp. 3768-3773 (Nov. 11, 2005).

Cole, Chad A. et al., "Analysis and Design of Moderate Length Regular LDPC Codes with Low Error Floors," Information Sciences and Systems, 2006 40th Annual Conference, pp. 823-828 (Feb. 23, 2006).

Kim, Woo Tai et al., Performance of STBC with Turbo Code in HARQ Scheme for Mobile Communication System. Telecommunications, 2003. ICT 2003. 10th International Conference, pp. 85-59 (Feb. 23, 2003).

Koike T., et al., "Hybrid ARQ scheme suitable for coded MIMO transmission" Communications, IEEE International Conference, Paris, France, pp. 2919-2923 (Jun. 20, 2004).

Krishnaswamy, Dilip, et al., "Multi-Level Weighted Combining of Retransmitted Vectors in Wireless Communications." IEEE VTC (Sep. 2006).

Nagareda R et al., "OFDM mobile packet transmission system with multiuser detection and metric combining ARQ" Vehicular Technology Conference, 2004 VTC2004—Fall. 2004 IEEE 60th Los Angeles, CA USA, pp. 709-713 (Sep. 26, 2004).

Onggosanusi, Eko N. et al., "Hybrid ARQ Transmission and Combining for MIMO systems" 2003 International Conference on Communications, pp. 3205-3209 (May 11, 2003).

Samra H; Zhi Ding "New MIMO ARQ protocols and joint detection via sphere decoding" IEEE Transactions on Signal Processing [online], pp. 473-482 (Feb. 28, 2006).

Samra Harvino, Ding Zhi "Sphere decoding for retransmission diversity in MIMO flat-fading channels" ICASSP IEEE Int. Conf. Acoust. Speech Signal Process [online], pp. 585-588 (May 17, 2004).

Schmitt M.P. "Improved retransmission strategy for hybrid ARQ schemes employing TCM" Wireless Communications and Networking Conference, 1999 IEEE New Orleans, LA, pp. 1226-1228 (Sep. 21, 1999).

Tirkkonen, O et al., "Square-Matrix Embeddable Space-Time Block Codes for Complex Signal Constellations," IEEE Trans. Info. Theory, vol. 48, pp. 384-395 (Feb. 2002).

Tong, Wen et al., Soft packet combing for STC re-transmission to improve H-ARQ performance in MIMO mode. Proposal for IEEE 802.16 Broadband Wireless Access Working Group, pp. 1-5 (Jul. 7, 2004).

* cited by examiner $$H \cdot D = S$$

FIG. 2A $$H = \begin{bmatrix} 1 & 1 & 0 \\ 1 & 0 & 0 \\ 0 & 0 & 1 \\ 0 & 0 & 0 \\ 1 & 1 & 0 \end{bmatrix}$$

| Trapping Sets | Syndrome Weight | # Bit Nodes | Syndrome Pattern | | Error Pattern | |
|---|---|---|---|---|---|---|
| 1 | | $v_1$ | $y_{m1}$ | $y_{c1}$ | $x_{m1}$ | $x_{c1}$ |
| 2 | $W_1$ | $v_2$ | $y_{m2}$ | $y_{c2}$ | $x_{m2}$ | $x_{c2}$ |
| 3 | | $v_3$ | $y_{m3}$ | $y_{c3}$ | $x_{m3}$ | $x_{c3}$ |
| 4 | $W_2$ | | $y_{m4}$ | $y_{c4}$ | $x_{m4}$ | $x_{c4}$ |
| 5 | $W_3$ | $v_5$ | $y_m$ | $y_{c5}$ | $x_{m5}$ | $x_{c5}$ |
| 6 | | $v_6$ | $y_m$ | $y_{c6}$ | $x_{m6}$ | $x_{c6}$ |
| 7 | $W_4$ | $v_7$ | $y_{m7}$ | $y_{c7}$ | $x_{m7}$ | $x_{c7}$ |
| 8 | $W_5$ | $v_8$ | $y_{m8}$ | $y_{c8}$ | $x_{m8}$ | $x_{c8}$ |

FIG. 7

| Trapping Sets (v, w) | # Classes | # Failures | Frequency (%) |
|---|---|---|---|
| (6, 2) | 10 | 2920 | 58.40 |
| (8, 2) | 8 | 879 | 17.58 |
| (10, 2) | 9 | 561 | 12.2 |
| (5, 3) | 21 | 425 | 8.50 |
| (7, 3) | 12 | 121 | 2.42 |
| (7, 1) | 19 | 57 | 1.14 |
| (12, 2) | 25 | 22 | 0.44 |
| (11, 1) | 7 | 5 | 0.1 |
| (8, 4) | 33 | 1 | 0.02 |
| (5, 5) | 17 | 1 | 0.02 |
| total | | | 99.84 |

FIG. 8

(5, 3) Trapping Set (6, 2) Trapping Set (4, 2) Trapping Set

QC-LDPC DECODER WITH LIST-SYNDROME DECODING

CROSS-REFERENCE TO RELATED APPLICATIONS

This application is a continuation-in-part of co-pending U.S. patent application Ser. No. 13/397,479, filed Feb. 15, 2012, which is a continuation of U.S. patent application Ser. No. 12/180,229, filed Jul. 25, 2008 (now U.S. Pat. No. 8,127, 209), which claims the benefit of U.S. Provisional Application No. 60/952,747, filed Jul. 30, 2007. This application also claims the benefit of U.S. Provisional Application No. 61/601,790, filed Feb. 22, 2012 and U.S. Provisional Application No. 61/606,104, filed Mar. 2, 2012. Each of the above-identified applications is hereby incorporated by reference herein in its entirety.

BACKGROUND

In general, this disclosure relates to data processing. In particular, the disclosure relates to data processing in quasi-cyclic low density parity check (QC-LDPC) decoders.

With the continuing demand for high-reliability transmission of information in digital communication and storage systems, and with the rapid increase in available computational power, various coding and decoding techniques have been investigated and applied to increase the fidelity of these systems. One such coding technique, low-density parity check (LDPC) coding, was first proposed in the 1960s, but was not used until the late 1990s when researchers began to investigate iterative coding and decoding techniques.

LDPC codes form a class of linear block codes that are of particular interest due to their capability of approaching the Shannon limit for channel capacity. LDPC coding techniques are generally iterative in nature, and can be represented by many different types of parity check matrices. The structure of an LDPC code's parity check matrix can be, for example, random, cyclic, or quasi-cyclic. LDPC codes defined by quasi-cyclic parity check matrices are particularly common and computationally efficient. These codes are known as quasi-cyclic low density parity check (QC-LDPC) codes.

The performance capability of a coding scheme, such as a LDPC coding scheme, is often described by the code's performance curve, which is a plot of signal-to-noise ratios (SNR) vs. Bit Error Rate (BER) or Sector Error Rate (SER). The performance curve of LDPC codes generally consists of two regions: the waterfall region and the error floor region (see FIG. 3). In the waterfall region, the code's BER or equivalently, SER, decreases rapidly with improvements in SNR. However, in the high SNR operating region, the BER/SER disadvantageously plateaus to an error floor, meaning that further improvements in channel condition would not lead to lower BER/SER. Although the error floors of well designed LDPC codes are generally low, they might not be acceptable for communication channels that must guarantee high degree of data reliability.

SUMMARY

Accordingly, a system and method for reducing the error floor of LDPC codes, and QC-LDPC codes in particular, are disclosed. A decoder constructed in accordance with the principles of the present disclosure may include a primary iterative decoding stage followed by additional processing stages. The additional processing stages may be implemented using any suitable type of decoding circuitry, logic, or software, and may be configured to decode codewords that the iterative decoder failed to decode due to the existence of trapping sets. Trapping sets are sets of erroneous bits that result in few unsatisfied checks, and therefore cannot be iteratively decoded.

The decoding circuitry may utilize a trapping set look-up table storing the syndrome pattern and error pattern of one trapping set member of each of several trapping set classes. The trapping set classes represented in the look-up table may have members that are commonly occurring trapping sets. For example, the stored trapping set classes may include those trapping sets that, of all possible trapping sets, are most likely to occur.

The decoding circuitry may calculate the syndrome pattern c of a received codeword that was not successfully decoded by the iterative decoder. Using syndrome pattern c, the decoding circuitry may search the look-up table for a responsible trapping set class. This trapping set class may be the class that is most likely responsible for the iterative decoder's failure. The responsible trapping set class may be characterized by having a trapping set member, the most likely responsible trapping set, whose syndrome pattern is equal to c. Thus, in one embodiment, the decoding circuitry may compare c to the syndrome patterns stored in the look-up table. Although the syndrome pattern of only one member of each trapping set class is stored in the look-up table, the syndrome patterns of the remaining members of the represented trapping set classes may be calculated and compared to c as well. In one embodiment, applying quasi-cyclic shifts to the known syndrome pattern of one member of a trapping set class can produce the syndrome patterns of the remaining members. The process of searching the look-up table for the responsible trapping set class may be simplified by proving a look-up table indexed by syndrome weight.

If the responsible trapping set class is found in the look-up table, the decoding circuitry may retrieve the syndrome pattern c' and error pattern b' that are stored in the look-up table in connection with the responsible trapping set class. The decoding circuitry may then calculate the error pattern b of the received codeword based on its syndrome pattern c, and the syndrome pattern c' and error pattern b' obtained from the look-up table. In one embodiment where syndrome patterns c and c' have a quasi-cyclic shift difference of Δ, applying a quasi-cyclic shift of magnitude Δ to b' can produce the desired error pattern b.

With knowledge of b, which lists the locations of the erroneous bits in the received codeword, the decoding circuitry can correct the erroneous bits of the received codeword. For example, the decoder can then invert the erroneous bits and successfully correct the received codeword. By successfully decoding received codewords that are normally uncorrectable by iterative decoding, the decoder constructed in accordance with the present disclosure can advantageously lower the error floor.

The look-up table may be dynamic. In some embodiments, if no responsible trapping set class, corresponding to the calculated syndrome pattern c, is found in the look-up table, the decoding circuitry may attempt to decode the received codeword using alternate decoding algorithms. If the received codeword is decoded successfully, the decoding circuitry may determine the corresponding responsible trapping set class and add it to the look-up table. In some embodiments, the responsible trapping set classes listed in the look-up table may be sorted based according to failure frequency.

BRIEF DESCRIPTION OF THE DRAWINGS

The above and other aspects and advantages of the invention will be apparent upon consideration of the following detailed description, taken in conjunction with the accompanying drawings, in which like reference characters refer to like parts throughout, and in which:

FIG. 2A is a mathematical vector model of an LDPC code with parity check matrix H;

FIG. 2B is an illustrative parity check matrix H;

FIG. 2C is a Tanner graph of the illustrative parity check matrix of FIG. 2B;

FIG. 7 is an illustrative trapping set look-up table;

FIG. 8 is a table illustrating the error floor lowering capacity of the decoder in FIG. 6;

DETAILED DESCRIPTION

The disclosed technology is directed toward systems and methods for QC-LDPC decoding that lead to advantageously lowered error floors. In applications or devices where information may be altered by interference signals or other phenomena, error-correction codes, such as LDPC codes, can provide a measured way to protect information against such interference. As used herein, "information" and "data" refer to any unit or aggregate of energy or signals that contain some meaning or usefulness. Encoding may generally refer to the process of generating data in a manner that facilitates subsequent detection and/or correction of errors in the data, while decoding may generally refer to the counterpart process of detecting and/or correcting the errors. The elements of a coding system that perform encoding and decoding are likewise referred to as encoders and decoders, respectively.

Figure 1:
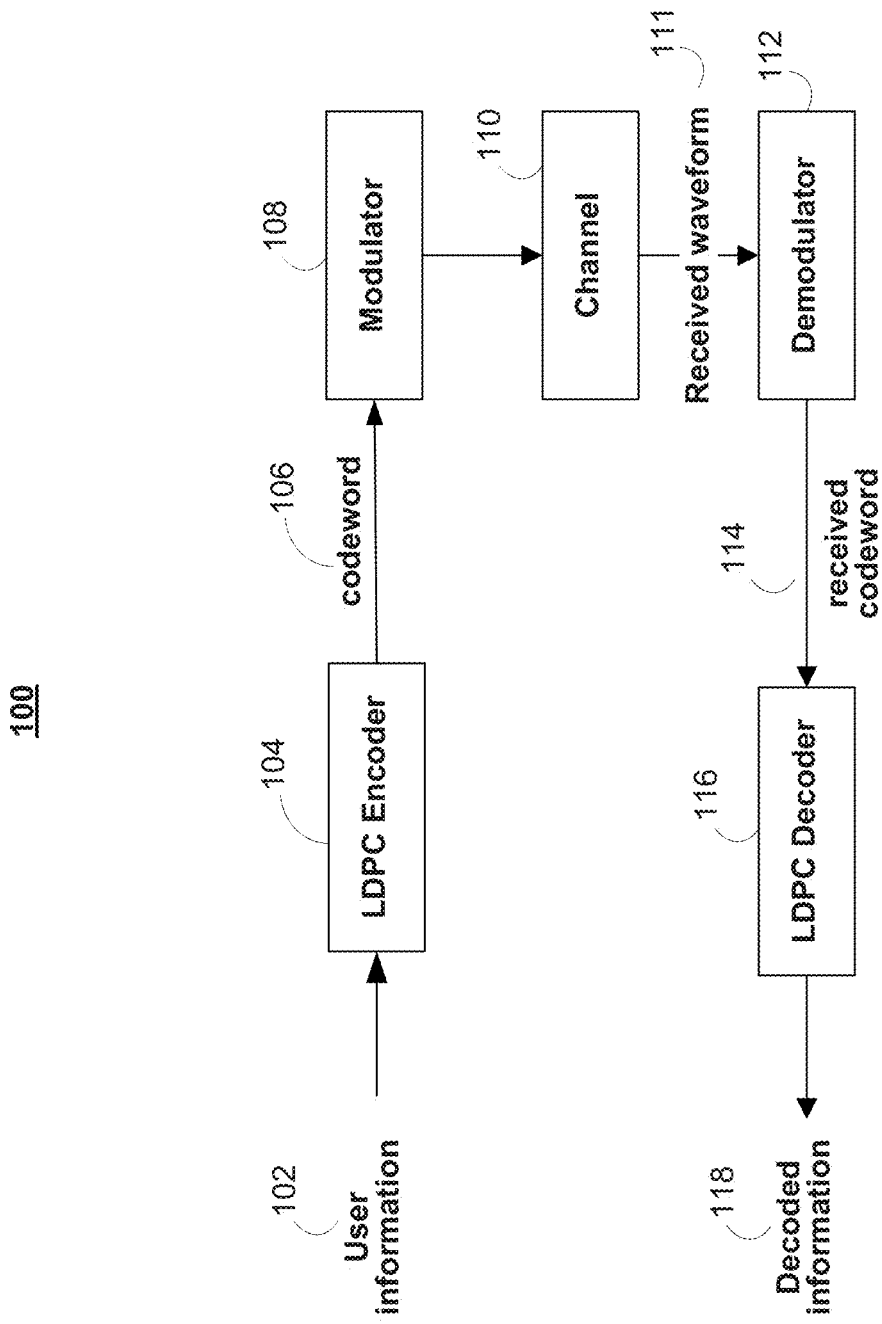
FIG. 1 is an illustrative block diagram of an error-correcting communication/storage system, according to an illustrative embodiment.

Referring to FIG. 1, there is shown an illustrative communication or data storage system 100 that utilizes error-correction codes for achieving reliable communication or storage. User information 102 is encoded through encoder 104. User information 102, often referred to as the message information or a message vector, may be grouped into units of k symbols, where each symbol may be binary, ternary, quaternary, or any other suitable type of data. However, for simplicity, embodiments of the present disclosure will be described in terms of binary bits. In the process of encoding user information 102, different codes can be used by encoder 104 to achieve different results.

As shown in FIG. 1, encoder 104 may encode user information 102 using a low density parity check (LDPC) code.

The result of encoding user information 102 is codeword 106, also denoted as c. Codeword 106 may be of a predetermined length, which may be referred to as n.

In one implementation, codeword 106 is passed to a modulator 108. Modulator 108 prepares codeword 106 for transmission on channel 110. Modulator 108 may use phase-shift keying, frequency-shift keying, quadrature amplitude modulation, or any suitable modulation technique to modulate codeword 106 into one or more information-carrying signals. Channel 110 may be an asymmetric or symmetric channel. Channel 110 may represent media through which the information-carrying signals travel. For example, channel 110 may represent a wired or wireless medium in a communication system, or an electrical (e.g., RAM, ROM), magnetic (e.g., a hard disk), or optical (e.g., CD or DVD) storage medium in which the information-carrying signals can be stored.

Due to interference signals and other types of noise and phenomena, channel 110 may corrupt the waveform transmitted by modulator 108. Thus, the waveform received by demodulator 112, received waveform 111, may be different from the originally transmitted signal waveform. Received waveform 111 may be demodulated with demodulator 112. Demodulator 112 can demodulate received waveform 111 with filters, multiplication by periodic functions, or any suitable demodulation technique corresponding to the type of modulation used in modulator 108. The result of demodulation is received codeword 114, which may contain errors due to channel corruption.

Received codeword 114 may then be processed by decoder 116. Decoder 116 can be used to correct or detect errors in received codeword 114. Decoder 116 may have two stages, where one stage uses an iterative message-passing decoding algorithm and the other stage uses a list-syndrome based decoding algorithm. The iterative message-passing decoding algorithm may be, for example, an iterative belief propagation algorithm or a sum-product algorithm. When utilizing such an iterative algorithm, decoder 116 may perform several iterations of the algorithm until the output of decoder 116 converges to a valid codeword. In some scenarios, the output of decoder 116 may fail to converge to a valid codeword. Decoder failure may be caused by a variety of reasons, which will be discussed further below. Because the output of decoder 116 may never converge to a valid codeword in certain situations, decoder 116 may be equipped with a maximum iteration limit, which can be any suitable predetermined number. When decoder 116 reaches the maximum iteration limit, decoder 116 may automatically terminate operation and move on to the next received codeword 114. However, if the output of decoder 116 successfully converges to a valid codeword, decoder 116 may then output decoded information 118.

The LDPC codes embodied by encoder 104 and decoder 116 are conventionally represented by mathematical vector models. In particular, an LDPC code can be described by its parity check matrix H. Referring now to FIG. 2A, there is shown a vector model 200 of an LDPC code relating parity check matrix 202, codeword 204, and syndrome 206, where codeword 204 and syndrome 206 are vectors. Syndrome 206 is equal to the null vector if and only if codeword 204 is a valid codeword. Codeword 204 may be, for example, n-length codeword 106 or n-length received codeword 114 of FIG. 1. When codeword 204 has length n and syndrome 206 has length r, parity check matrix 202 may have dimensions r×n. Syndrome length r may satisfy the inequality r≥n−k and where k is the length of the information being encoded (e.g., length of user information 102 of FIG. 1).

An LDPC code may also be graphically represented as a Tanner graph, a bipartite graph showing the relationship between a LDPC code's codeword bits and syndrome bits. The advantages of using a Tanner graph representation of a LDPC code include access to efficient graph-based message-passing algorithms for decoding. An exemplary 3×5 parity check matrix 210 is shown in FIG. 2B, and its corresponding Tanner graph 220 is shown in FIG. 2C. Parity check matrix 210 may be used with five-bit codewords and may produce three-bit syndromes. Nodes 212-214 of Tanner graph 220 correspond to each bit of the three-bit syndromes produced by matrix 210, and are referred to as the Tanner graph's check nodes. Nodes 215-219 correspond to the five-bit codewords that may be used with matrix 210, and are called the Tanner graph's bit nodes. The undirected edges connecting various check nodes with bit nodes correspond to the locations of the non-zero entries of matrix 210. In other words, parity check matrix 210 is the adjacency matrix of Tanner graph 220. For example, the 1 at the (1,2) location of matrix 210 indicates that there is an edge between check node 212 and bit node 216, while the 0 at the (1,3) location indicates that there is no edge between check node 212 and bit node 217.

The check nodes of a Tanner graph can either be satisfied or unsatisfied, where a satisfied node has a binary value of 0 and an unsatisfied node has a binary value of 1. A check node is satisfied (i.e., equal to 0) if the values of the bit nodes connected to the check node sum to an even number. In other words, the value of each check node is equal to the sum modulo two of the values of the bit nodes to which it is connected. For example, check node 212 of illustrative Tanner graph 220 would be satisfied if the values of bit nodes 215 and 216 were both 1 or both 0. Furthermore, when a check node is unsatisfied, at least one of the bit nodes connected to it is in error. Thus, the values of check nodes 212-214 (or equivalently, the value of the syndrome produced by matrix 210) provide a parity check on each codeword received by a LDPC decoder (i.e., decoder 116 of FIG. 1), thereby providing error correction capability to communication/storage system 100 of FIG. 1.

Figure 3:
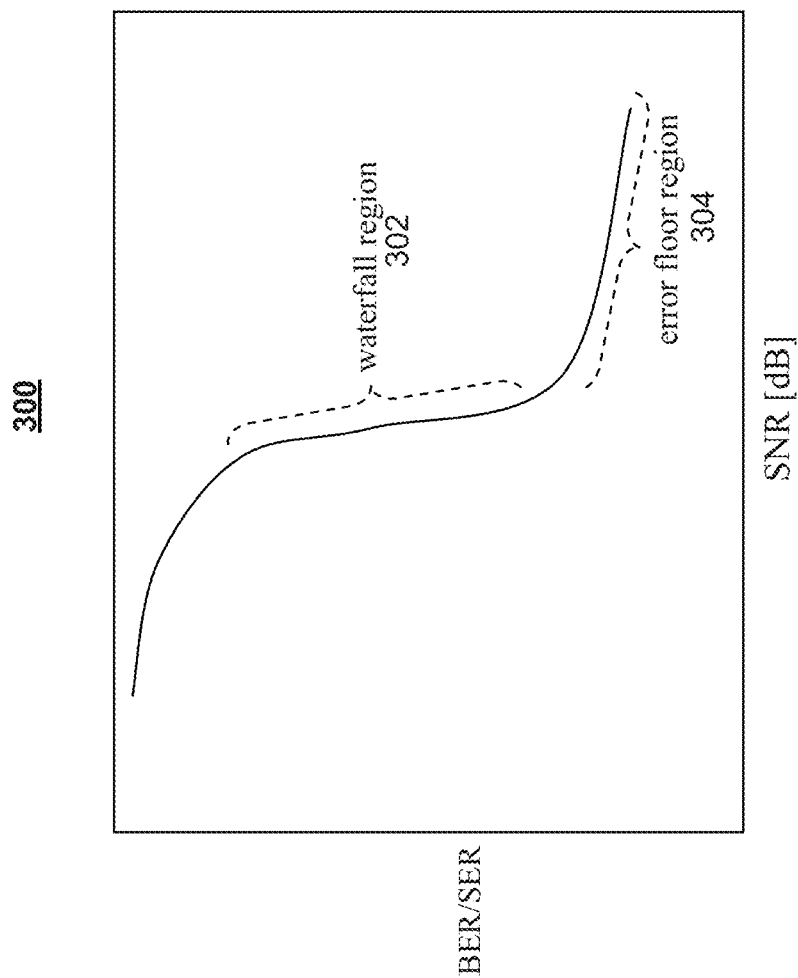
FIG. 3 is a performance curve of an exemplary LDPC code.

As mentioned previously, the performance capability of LDPC codes, as described by a mapping of SNR vs. BER/SER, generally comprises two regions of operation: the waterfall region and the error floor region. FIG. 3 shows an exemplary LDPC performance curve 300 with waterfall region 302 and error floor region 304. In error floor region 304, the BER/SER of the LDPC code disadvantageously asymptotes to a lower limit. Because the normal operating conditions for a communication/storage channel generally correspond to the error floor region 304, lowering error floor 304 can improve the performance of the LDPC code.

The asymptotic behavior of performance curve 300 in error floor region 304 is at least partially due to the existence of trapping sets in LDPC codes. Referring back to the Tanner graph representation of LDPC codes, as described above in connection with FIG. 2C, trapping sets are subgraphs of the Tanner graph of a LDPC code that cause decoder failure. Trapping sets contain the erroneous bit nodes that remain uncorrected even after the maximum number of iterations (of a belief propagation algorithm, for example) is performed by a decoder, such as decoder 116 of FIG. 1. The number of such bit nodes may be small, because the iterative decoder typically fails for few bits after performing the maximum number of iterations. Thus, the trapping set may include a small number of the total bit nodes in the Tanner graph for the LDPC code, along with the check nodes that are connected to the erroneous bits.

Figure 4:
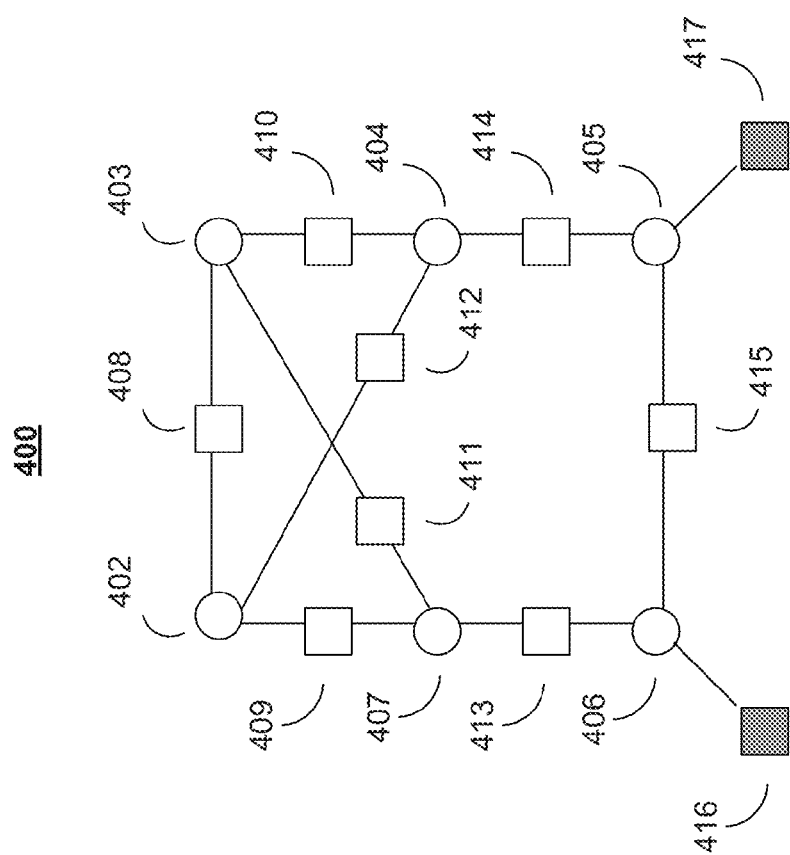
FIG. 4 is an illustrative trapping set.

An illustrative trapping set 400 is shown in FIG. 4. Trapping set 400 comprises satisfied check nodes 408-415, unsatisfied check nodes 416-417, and uncorrected bit nodes 402-407. Trapping set 400 is referred to as a (6,2) trapping set because there exists six erroneous bit nodes and two unsatisfied check nodes. This nomenclature may be generalized to indicate trapping sets with v erroneous bit nodes and w unsatisfied check nodes as a (v,w) trapping set. The number of unsatisfied check nodes w is also called the syndrome weight of the trapping set.

Figure 5:
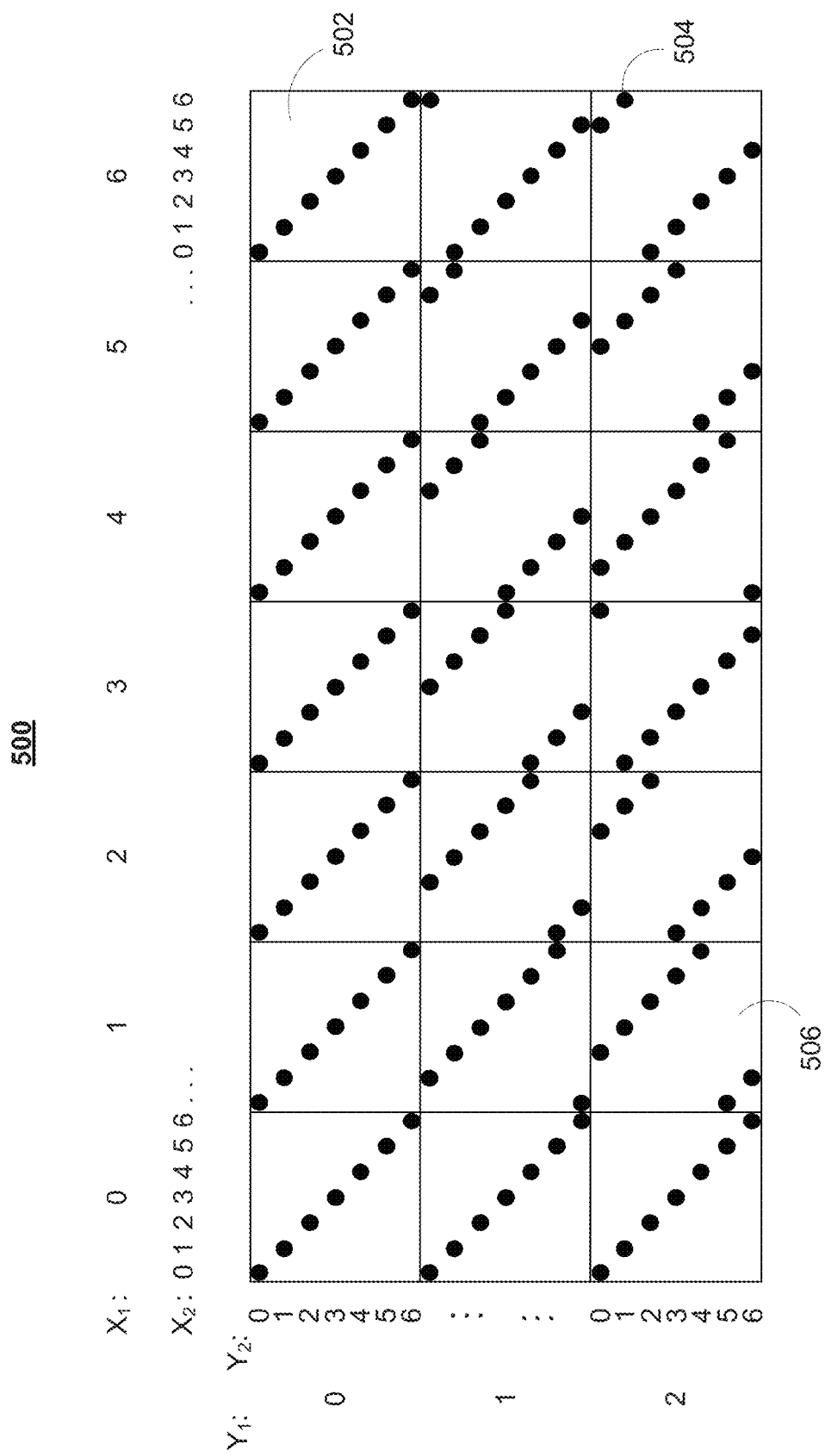
FIG. 5 an illustrative parity check matrix of a QC-LDPC code.

Because trapping sets are largely responsible for the existence of error floors in LDPC codes, providing decoding methods that can correct errors caused by trapping sets is imperative for lowering the error floor. Advantageously, trapping sets of one type of LDPC code, QC-LDPC codes, have special properties that may be used to efficiently lower the error floor. As mentioned previously, QC-LDPC codes are a commonly used type of LDPC codes. QC-LDPC codes are computationally efficient, and are thus desirable for hardware implementation of decoders. For example, LDPC encoder 104 and LDPC decoder 116 of FIG. 1 can preferentially employ a QC-LDPC code. QC-LDPC codes are characterized by parity check matrices that are quasi-cyclic. A quasi-cyclic matrix can be composed of a plurality of Z×Z circular sub-matrices known as circulants. FIG. 5 shows an illustrative quasi-cyclic matrix 500 that may serve as the parity check matrix of a QC-LDPC code. Illustrative quasi-cyclic matrix 500 is composed of twenty-one 7×7 circulants (e.g., circulants 502 and 506). Each dot 504 represents a 1 entry in matrix 500. The remaining (not shown) entries of matrix 500 are 0. Thus, matrix 500 is a sparse matrix. Each circulant is either an identity matrix, such as matrix 502, or a cyclic shift of the identity matrix, such as matrix 506. For example, each entry of matrix 506 is cyclically shifted two columns to the right from the identity matrix.

Trapping sets of QC-LDPC codes can be advantageously represented in node index notation, which uses vectors b and c to store the locations of uncorrected bits and unsatisfied checks, respectively. For a (v,w) trapping set, b may be a v-length vector listing the vector indices of the uncorrected bits in a codeword vector (e.g., received codeword 114 of FIG. 1). For example, if the third bit in a received codeword is the first erroneous bit due to the trapping set, then the first entry of b may be 2 (vector indices generally begin at 0). Similarly, vector c may be a w-length vector listing the vector indices of the unsatisfied checks in a syndrome vector (e.g., syndrome 206 of FIG. 2). Notice that the entries of codeword vectors and syndrome vectors are generally binary if a binary code is used. However, the elements of vectors b and c are index numbers and therefore generally not binary. Vectors b and c are referred to as the error pattern and syndrome pattern, respectively.

In some scenarios, it may be advantageous to express the elements of b and c in terms of the row and column indices of the parity check matrix of a QC-LDPC code. For example, with reference to matrix 500, the columns of matrix 500 are indexed by a "mother code index" $x_m$ and a "circulant index" $x_c$. Mother code index $x_m$ indexes the number of circulants that compose the columns of matrix 500. Circulant index $x_c$ indexes the number of columns within each circulant. Circulant index $x_c$ restarts from 0 with each new circulant. For example, in FIG. 5, both $x_m$ and $x_c$ can range from 0 and 6. Thus, each element of b, b[j] for j={0, 1, 2, ... v−1}, of a (v,w) trapping set associated with matrix 500 can be expressed by the following equation:

$$b[j] = x_m[j] * Z + x_c[j], j = \{0, 1, 2, \ldots v-1\}, \quad \text{(Eq. 1)}$$

where Z×Z is the circulant dimension of matrix 500, and $x_m[j]$ and $x_c[j]$ are respectively the mother code index and the circulant index associated with erroneous bit node b[j]. The v mother code and circulant indices associated with the elements of b may be collectively referred to as vectors $x_m$ and $x_c$.

The indexing for the rows of matrix 500 follow an analogous pattern. More specifically, mother code index $y_m$ indexes the number of circulants that compose the rows of matrix 500, and circulant index $y_c$ indexes the number of rows within each circulant. Each element of c, c[i] for i={0, 1, 2, ... w−1}, of the (v,w) trapping set is thus analogously expressed by the following equation:

$$c[i]=y_m[i]*Z+y_c[i] \ i=\{0, 1, 2, \ldots w-1\}, \quad \text{(Eq. 2)}$$

where the w mother code indices and w circulant indices for the rows of matrix 500 are collectively referred to as $y_m$ and $y_c$, respectively.

The Tanner graph of a QC-LDPC code with Z×Z circulants is said to have an automorphism of size Z. In other words, for any subgraph corresponding to a trapping set, Z−1 other subgraphs with the same properties and structure exist, and which correspond to Z−1 other trapping sets. Thus, if one can find a single (v,w) trapping set of QC-LDPC code, then there exists a class of Z (v,w) trapping sets, where each member of the class may be constructed by quasi-cyclically shifting another member of the class. A quasi-cyclic shift by $\Delta$ of a trapping set represented by error pattern b and syndrome pattern c is defined as follows:

$$b[j]'=x_m[j]*Z+\text{mod}\ (x_c[j]+\Delta,Z) \quad \text{(Eq. 3)}$$

$$c[j]'=y_m[i]*Z+\text{mod}\ (y_c[j]+\Delta,Z) \quad \text{(Eq. 4)}$$

where b' and c' are the error pattern and syndrome pattern of the newly constructed trapping set, respectively, and where $\Delta=\{0, 1, 2, \ldots Z-1\}$.

Because knowledge of the error pattern and syndrome pattern of one member of a trapping set class is sufficient for generating the error pattern and syndrome pattern of each of the other class members, QC-LDPC trapping sets may be compactly stored in memory by only storing the error pattern and syndrome pattern of one class member. It is advantageous to know the error and syndrome patterns of trapping sets because they may be used to locate and correct bits that are uncorrectable by iterative decoding techniques. Thus, in one embodiment, trapping sets are stored in memory to prevent decoder failures due to trapping sets.

Figure 6:
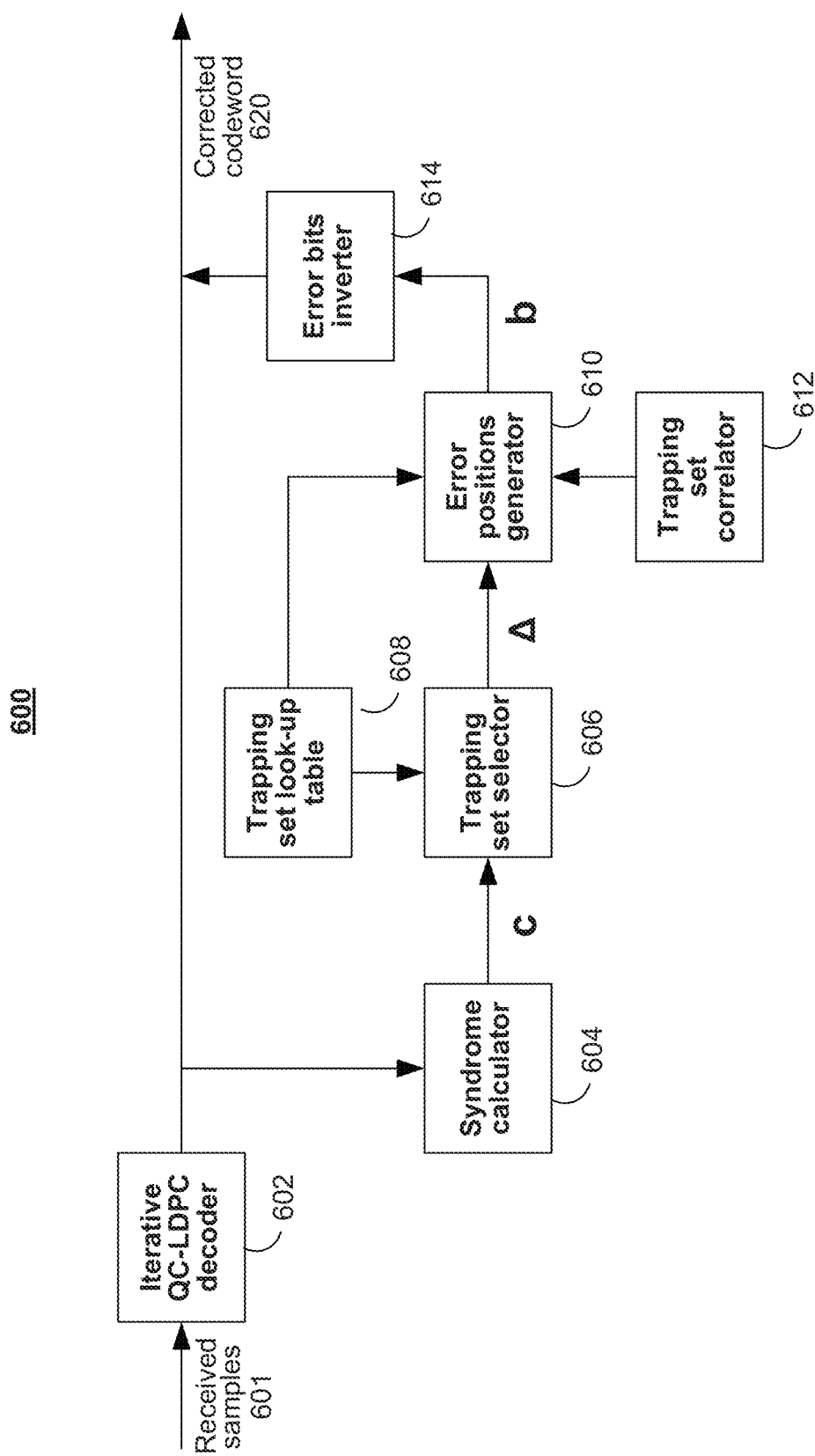
FIG. 6 is a high level block diagram of an error floor reducing decoding system, according to an illustrative embodiment.

Referring now to FIG. 6, there is shown a block diagram of a QC-LDPC decoder 600 that utilizes the memory-saving properties of QC-LDPC trapping sets described above to reduce the error floor of the decoder. In particular, decoder 600 uses a trapping set look-up table 608, where commonly occurring trapping sets are stored, in the event that iterative QC-LDPC decoder 602 fails. Decoder 600 may be used to implement LDPC decoder 116 of FIG. 1.

Iterative QC-LDPC decoder 602, the first stage of decoder 600, takes received samples 601 as input. Received samples 601 may be, for example, digital samples of received waveform 111 of FIG. 1. Iterative decoder 602 may apply a standard iterative QC-LDPC decoding algorithm to received samples 601, such as a message-passing algorithm, to determine the correct codeword. Iterative decoder 602 may operate until its output converges to a valid codeword, which it may then output as corrected codeword 620. However, the output of iterative decoder 602 may fail to converge to a valid codeword due to the existence of trapping sets. If the output of iterative decoder 602 fails to converge, iterative decoder 602 may automatically terminate operation when it reaches a maximum iteration limit. Iterative decoder 602's maximum iteration limit may be hardwired or programmable.

In the case that iterative decoder 602 fails and the maximum number of iterations is performed, operation of decoder 600 may then proceed to syndrome calculator 604. In some embodiments, syndrome calculator 604 may calculate the syndrome vector (i.e., s of FIG. 2A) or syndrome pattern (i.e., c) corresponding to received samples 601. In other embodiments, syndrome calculator 604 may calculate the syndrome vector or pattern using the output of iterative decoder 602. When the output of iterative decoder 602 fails to converge, the syndrome vectors/patterns that syndrome calculator 604 produce may be non-zero. In embodiments where syndrome calculator 604 operates on the output of iterative decoder 602, iterative decoder 602 may have corrected all of the errors in received samples 601 that were not caused by a trapping set. The non-zero syndrome vectors/patterns may therefore be solely due to any remaining errors from a trapping set. If syndrome calculator 604 produces a binary syndrome vector, the syndrome vector may first be converted into a syndrome pattern before further processing. The conversion may be accomplished using a simple loop and counter algorithm, for example. For simplicity, FIG. 6 shows syndrome calculator 604 outputting the syndrome pattern c.

The next stage of decoder 600, trapping set selector 606, may use syndrome pattern c and a trapping set look-up table 608 to determine the trapping set and trapping set class that most likely caused iterative decoder 602 to fail to decode received samples 601. Trapping set look-up table 608 can be a table stored in memory (e.g., a ROM) that contains a listing of dominant trapping sets of the QC-LDPC code employed by decoder 600. Dominant trapping sets may be the trapping sets that occur most frequently and/or cause the greatest number of failures in a traditional iterative QC-LDPC decoder, such as iterative decoder 602.

An exemplary trapping set look-up table 608 is shown in FIG. 7 as table 700. The rows of table 700 list the syndrome pattern and error pattern of each of several dominant trapping sets. For exemplary purposes, table 700 lists eight dominant trapping sets, as shown in column 702. The trapping sets listed in table 700 are indexed by syndrome weight w, the number of unsatisfied check nodes in a trapping set. As shown in column 704, trapping sets with the same syndrome weight (e.g., trapping sets 1-3) are stored together in a sub-table 716. Some sub-tables, such as sub-table 718, may only contain one trapping set entry.

In some embodiments, the order in which the sub-tables are listed in table 700 may be in numerical order dependent on the syndrome weight. For example, $w_1$ may be the lowest number in column 704 and $w_5$ may be the highest. In other embodiments, the sub-tables may be arranged in another order. For example, each dominant trapping set may be associated with a corresponding frequency of failure and accordingly sub-tables in look-up table 608 may be sorted by frequency of failure.

As described in greater detail below in connection with FIG. 8, each trapping set may account for a certain frequency (or percentage) of iterative decoding failures. Accordingly, look-up table 608 may list a frequency of failure (not shown) for each dominant trapping set listed in look-up table 608. The order of the sub-tables may therefore be based on the frequency of failure of each dominant trapping set. The sub-tables may be arranged in order of either increasing or decreasing frequency of failure. Arranging the sub-tables in order of decreasing frequency of failure, i.e., listing the dominant trapping set with the highest frequency of failure first, may advantageously enable faster retrieval of error patterns in the dominant trapping sets responsible for the most number of failures, thereby reducing search time.

The frequency of failure associated with a trapping set may be pre-determined by running the illustrative decoder on a large sample of randomly corrupted codewords. Additionally and/or alternatively, the frequency of failure of each dominant trapping set listed in look-up table 608 may dynamically be updated during operation of decoder 600. For example, dominant trapping sets listed in look-up table 608 that may be accessed by trapping set selector 606 more frequently may be re-arranged to appear closer to the top of look-up table 608.

Column 706 of table 700 lists the number of uncorrected bits in each trapping set. Together, columns 704 and 706 provide a data pair (v,w) that at least partially identifies the trapping set class in which each trapping set listed in table 700 belongs. In order to conserve memory, only one trapping set per trapping set class may be listed in table 700. The other members of each trapping set class may be obtained by quasi-cyclically shifting the trapping set member that is listed in table 700.

Also listed in table 700 for each trapping set entry are the row mother code and circulant indices, in columns 708 and 710, respectively, and the column mother code and circulant indices, in columns 712 and 714, respectively. The row mother code and circulant indices in columns 708 and 710 may be used to calculate the syndrome pattern of each trapping set listed in table 700 via Equation 2. Similarly, the column mother code and circulant indices in columns 712 and 714 may be used to calculate the error pattern of each trapping set entry via Equation 1.

As illustrated by trapping sets 2 and 3 in table 700, two or more trapping sets may have the same (v,w) pair but belong in different classes. In particular, trapping sets 2 and 3 are shown to have $v_2$ erroneous bit nodes and a syndrome weight of $w_1$. Trapping sets 2 and 3 therefore are not related in the manner described in connection Eq. 3 and Eq. 4, and may be distinguished from each other based on the location of their erroneous bit nodes and unsatisfied checks (e.g., from columns 708, 710, 712, and/or 714 in table 700).

Referring again to FIG. 6, trapping set selector 606 may use table 700 to determine the trapping set and trapping set class that is most likely responsible for iterative decoder 602's decoding failure. In one embodiment, trapping set selector 606 determines the responsible trapping set by comparing syndrome pattern c to the syndrome patterns listed in table 700. In particular, trapping set selector 606 may first check if the syndrome weight of syndrome pattern c is listed in table 700. If table 700 is organized such that the syndrome weights in column 704 are in numerical order, trapping set selector 606 may initially check if the syndrome weight of c is within the range bounded by $w_1$ and $w_5$ of column 704.

If the syndrome weight of c is present in table 700, trapping set selector 606 may then compare the mother code vector $y_m$ of received samples 601 to the mother code vectors listed in column 708. If at least one matching mother code vector is found in column 708, such as entries 720 and 722, then trapping set selector 606 may continue operation. Two syndrome patterns with equal two mother code vectors may be in the same trapping set class. If no match is found, trapping set selector 606 may abort operation and decoder 600 may start processing on the next received codeword. In the former scenario, for each entry in column 708 that is equal to $y_m$, trapping set selector 606 may retrieve the corresponding column circulant vector (i.e., $y_{c5}$ and $y_{c6}$). Trapping set selector 606 may then calculate the quasi-cyclic shift difference between the first check node of c and the first check node of each trapping set listed in table 700 whose mother code vector equals $y_m$ (i.e., trapping sets 5 and 6). Lastly, trapping set selector 606 may apply the respectively calculated shift differences to $y_{c5}$ and $y_{c6}$, and determine if any of the resulting syndrome patterns equals c. Suppose for illustrative purposes that applying shift difference $\Delta$ to $y_{c5}$ generates a syndrome pattern $y_m*Z+\mathrm{mod}(y_{c5}+\Delta, Z)$ that is equal to c. Then trapping set 5 and the trapping set responsible for iterative decoder 602's failure may be in the same class (i.e., the responsible trapping set class), and quasi-cyclically shifting trapping set 5 by $\Delta$ may produce the responsible trapping set. The syndrome pattern and error pattern stored in table 700 in connection with the responsible trapping set class may be generally referred to as c' and b', respectively.

In some scenarios, trapping set selector 606 may not be able to find a responsible trapping set using table 700. This may be because the responsible trapping set class is not represented in table 700 or the errors in the received codeword were not caused by a trapping set. In this case, decoder 600 might not be able to determine the correct codeword corresponding to received samples 601 and may abort operation. Alternatively, decoder 600 may employ other decoding techniques, as described below in connected with FIG. 10. The success rate of decoder 600 is highly dependent on the size of table 700. The responsible trapping set is more likely to be listed in a larger look-up table than a smaller table. However, larger tables require more hardware resources, like memory. Therefore, the size of table 700 is a trade-off between decoder performance and available resources.

Referring back to FIG. 6 and the illustrative example above, trapping set selector 606 may output the quasi-cyclic shift difference $\Delta$ calculated for trapping set 5 to the next stage of decoder 600, error positions generator 610. Error positions generator 610 may then retrieve from table 700 the mother code vector $x_{m5}$ and circulant vector $x_{c5}$ associated with trapping set 5 to compute the error pattern b of the responsible trapping set. Error positions generator 610 may calculate error pattern b by applying a quasi-cyclic shift of magnitude $\Delta$ to $x_{c5}$. Thus, $x_{c5}$ and $y_{c5}$ are shifted by the same amount.

As mentioned previously, table 700 may store the syndrome and error patterns of one trapping set per trapping set class. Generally, decoder 600 may determine the class in which the responsible trapping set is in, and calculate from the syndrome pattern representing the responsible class in table 700 a shift difference $\Delta$ between the listed syndrome pattern and the responsible trapping set's syndrome pattern. The same $\Delta$ is then applied on the error pattern of the listed trapping set to compute the error pattern b of the responsible trapping set. Thus, error pattern b may be obtained even if it is not directly stored in table 700.

Error pattern b advantageously lists the locations of the erroneous bits in the codeword corresponding to received samples 601. Thus, decoder 600 may invert the erroneous bits in the codeword corresponding to received samples 601, as indicated by error pattern b, to produce corrected codeword 620. This operation may be performed by error bits inverter 614, the last stage of decoder 600. Error bit inverter 614 may contain software that loops through the codeword corresponding to received samples 601 to invert bits in accordance with the index location numbers listed in b.

Sometimes there may be two or more trapping sets that have the same syndrome pattern. For example, if $y_{c5}$ and $y_{c6}$ in table 700 were equal, then trapping sets 5 and 6 of table 700 may have the same syndrome pattern. In these scenarios, trapping set selector 606 and error positions generator 610 may operate on both trapping sets to find two potential error patterns. To select between the resulting error patterns, trapping set correlator 612 may use any of a variety of suitable correlation criteria. In some embodiments, trapping set correlator 612 may use a log likelihood ratio (LLR) criteria. For example, trapping set correlator 612 may operate based on the assumption that the LLR of the true error bit has a smallest magnitude. Thus, in one embodiment, trapping set correlator 612 may calculate the sum of the magnitudes of the LLR of the error bits for each potential trapping sets, and may select the trapping set with the smallest sum.

In another embodiment, trapping set correlator 612 may compare the magnitude of the LLR of each error bit of the potential trapping sets to a predetermined threshold. Trapping set correlator 612 may then select the trapping set with the largest number of bits whose LLR is less than the threshold. In still another embodiment, trapping set correlator 612 may compute the LLR of the error bits before decoding and the resulting LLR after decoding. For example, for each error bit in an error pattern, trapping set correlator 612 can multiply the LLR of the error bits before decoding (i.e., a priori LLR) with the LLR after decoding (i.e., a posteriori LLR). Then, the sum of these multiplications for all the error bits can be calculated. This summation may indicate a correlation between the a priori LLRs and a posteriori LLRs. Finally, the calculated sums of the LLRs for different potential error patterns can be compared and the one with the smallest value may be selected. This is because the a priori LLR of an error bit will generally have either a small magnitude or an opposite sign as the a posteriori LLR, while the a posteriori LLR of an error bit may have large magnitude. Thus, the actual error pattern should have the smallest sum as compared to the other potential error patterns.

There may be several methods for generating trapping set look-up tables for use with decoder 600, such as table 700 (or equivalently, table 608). For example, table 700 may be populated by expert knowledge. An appropriate search algorithm and importance sampling method may also be used to search the Tanner graph to identify trapping sets. In a preferred embodiment, table 700 is generated by running a simulation of the employed QC-LDPC code. The simulation may feed randomly generated codewords subjected to additive white Gaussian noise through an iterative decoder, such as iterative decoder 602. The resulting syndrome patterns and error patterns (which are known because the original uncorrupted codeword is known), and their associated trapping sets, can then be stored in table 700. The simulation may also provide statistics on the number of decoder failures that can be attributed to particular trapping sets. In this way, the dominant trapping set classes of the QC-LDPC code can be determined and preferentially stored in table 700 over less important trapping set classes.

The performance of decoder 600 may be highly dependent on the size of trapping set look-up table 700. A look-up table containing a large number of trapping sets may allow better decoder performance than a look-up table with a smaller number of trapping sets because the former may cover more iterative decoder failure scenarios. However, memory constraints of the hardware on which table 700 is implemented (e.g., a ROM) may preclude look-up tables beyond a certain size. Thus, there is a trade off between the size of table 700 and the performance of decoder 600.

FIG. 8 illustrates through table 800 the relationship between the performance of an illustrative QC-LDPC decoder and its dominant trapping sets when the decoder is operating at a BER/SER of around $10^{-8}$. The data in table 800 may be obtained by running the illustrative decoder on a large sample of randomly corrupted codewords. Column 802 of table 800 lists the v and w of ten dominant trapping sets of the illustrative QC-LDPC code. Column 804 lists the number of trapping set classes having v bit nodes and w unsatisfied checks. As described above, each value of v and w may be associated with multiple trapping set classes, where each trapping set class has different bit node and check node locations. Column 806 lists the number of iterative decoder failures, from the total codeword sample, that may be attributed to each (v,w) trapping set in column 802. Column 808 lists the percentage of all iterative decoder failures accounted for by each trapping set. For the illustrative example shown in table 800, nearly all (i.e., 99.84%) of the iterative decoder failures caused by trapping sets can be attributed to merely 161 dominant trapping set classes. In other words, using table 800, decoder 600 of FIG. 6 may successfully correct 99.84% of the received codewords that cannot be iteratively corrected. Thus, utilizing modestly-sized memory components, decoder 600 can substantially improve the decoding capability of standard iterative QC-LDPC decoders, such as iterative decoder 602 of FIG. 6, and thereby lower the error floor of QC-LDPC codes.

Figure 9A:
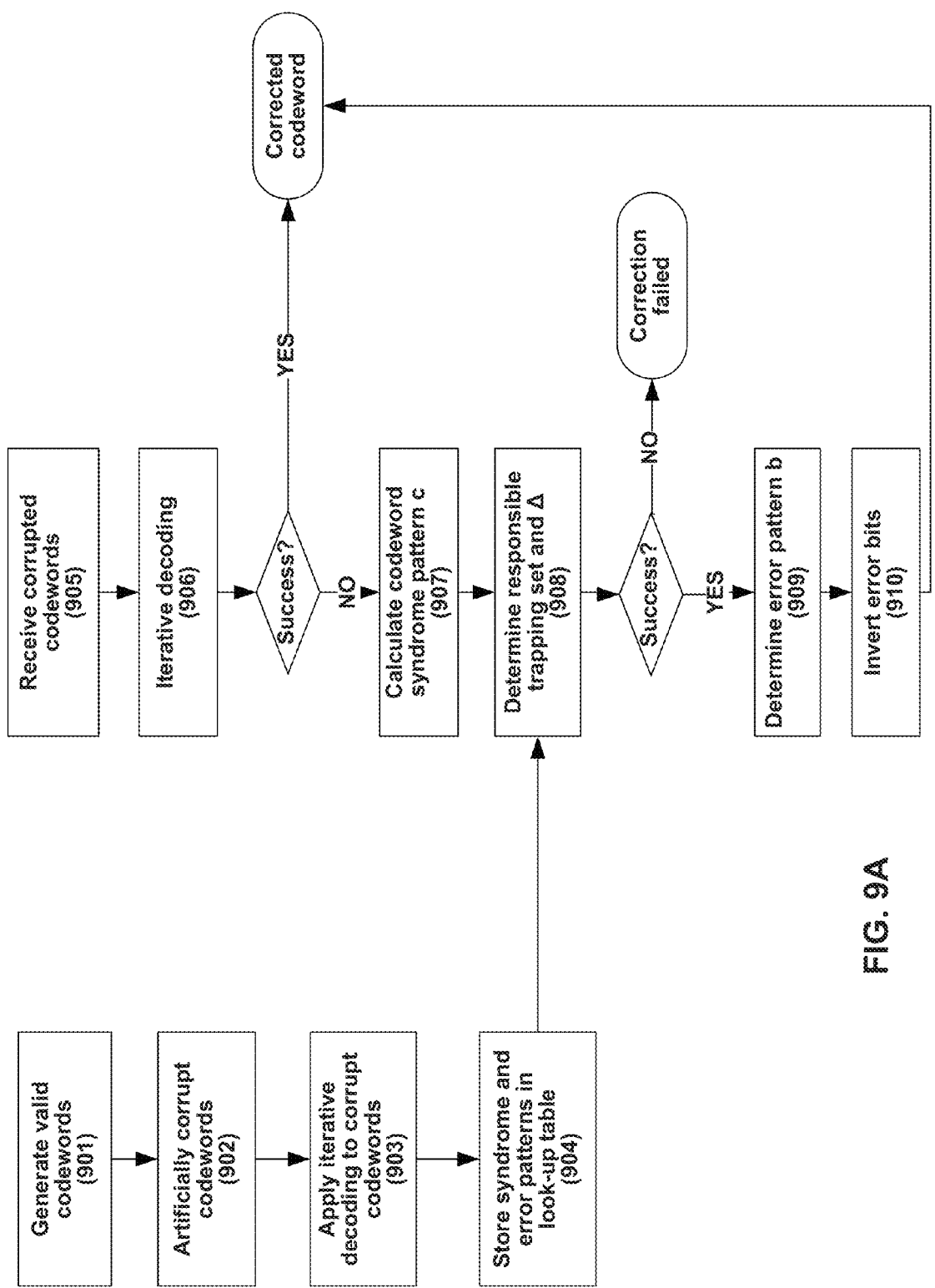
FIG. 9A is a flowchart illustrating the operation of a decoder, according to an illustrative embodiment.

Referring now to FIG. 9A, there is shown a flowchart 900 detailing a QC-LDPC decoding method, according to an illustrative embodiment. Flowchart 900 shows two series of operations: operations 901-904 and operations 905-910. Operations 901-904 pertain to the development of a trapping set look-up table, such as table 608 of FIG. 6 or table 700 of FIG. 7. This series of operations may be performed offline (i.e., prior to decoder runtime). Operations 905-910, on the other hand, pertain to the actual decoding process, and may be performed during the runtime of the decoder. Hardware required for offline operations need not be built into the product.

At operation 901 of the offline segment of flowchart 900, a large number of valid codewords of the employed QC-LDPC code is produced. The codewords can be produced randomly using a random number generator, or they can be produced systematically to cover the spectrum of possible codewords. At operation 902, the valid codewords are artificially corrupted to simulate transmission through a corruptive channel. For example, white Gaussian noise may be added to the valid codewords to simulate noise. At operation 903, a standard iterative QC-LDPC decoding algorithm is applied to the corrupted codewords. For example, operation 903 may be performed by iterative decoder 602 of FIG. 6. At operation 904, the syndrome and error patterns of the codewords that were unsuccessfully decoded in operation 903 due to trapping sets are calculated and stored, thereby creating a trapping set look-up table. The error patterns are determined by comparing the corrupted codewords with the original codewords produced at operation 901. A graph-based search algorithm and/or importance sampling method may also be used at operation 904 to identify the trapping sets. If a large enough sample of codewords is generated at operation 901, the relative dominance of the trapping sets can be statistically determined, in terms of absolute number of failures or percentage of failure. Thus, if there exists a memory constraint for the look-up table at operation 904, the syndrome and error patterns of the most dominant trapping sets may be preferentially stored over less dominant trapping sets. In addition, as discussed above, one may store one syndrome and error pattern pair in connection with each trapping set class because the syndrome and error patterns of the other class members can be constructed using Equations 1-4.

Referring now to runtime operations 905-910, corrupted codewords are received for decoding at operation 905. At operation 906, a standard iterative decoding algorithm is applied to the received codewords. For example, operation 906 may be performed by iterative decoder 602 of FIG. 6. If the iterative decoding process at operation 906 converges to a valid codeword, the decoding process is concluded and the corrected codeword is outputted. However, if the iterative decoding at operation 906 does not converge to a valid codeword after a decoder-imposed maximum number of iterations is performed, then the decoding process proceeds to operation 907, where the syndrome pattern c of the received codeword is calculated. The syndrome pattern may be calculated in node index notation, like syndrome pattern c in FIG. 6. If a binary vector syndrome is calculated instead, like syndrome 206 in FIG. 2A, the binary vector syndrome may be converted into syndrome pattern notation before proceeding with operations 908-910.

Figure 9B:
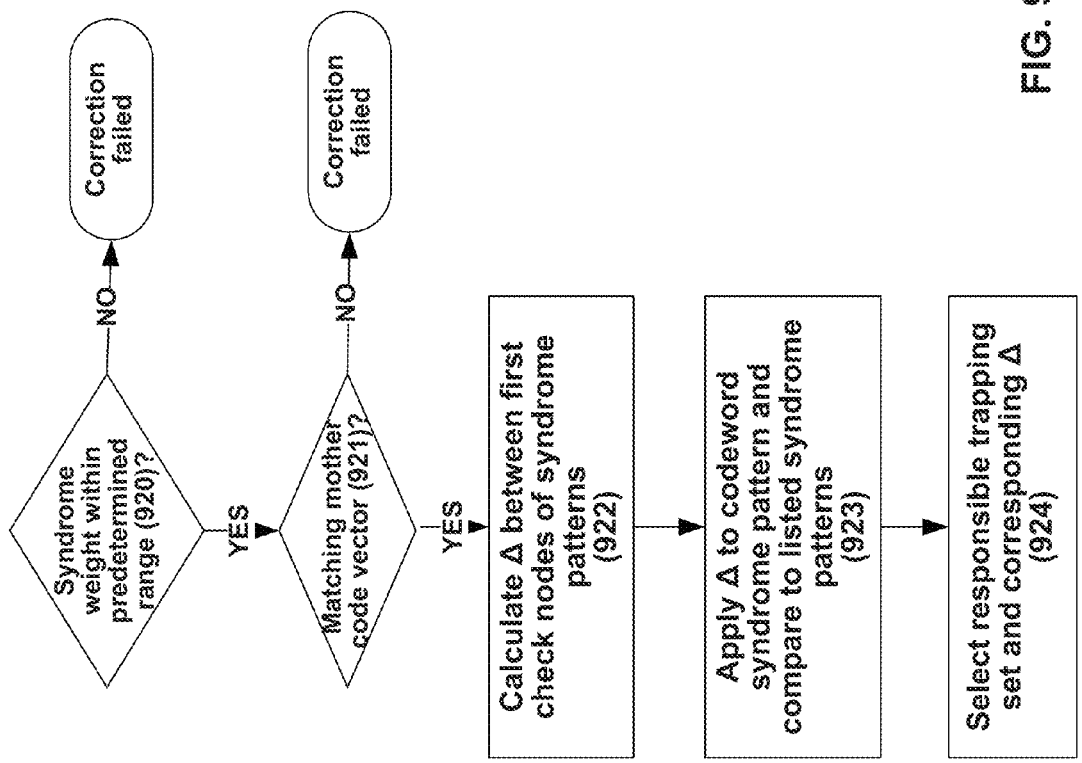
FIG. 9B is a more detailed flowchart illustrating trapping set selection, according to an illustrative embodiment.

At operation 908, the look-up table created at operation 904 may be used to determine the trapping set and trapping set class that is responsible for the failure at operation 906. A more detailed flowchart illustrating trapping set selection 908, according to an illustrative embodiment, is shown in FIG. 9B. Referring to FIG. 9B, at operation 920, the decoder may check the syndrome weight of the received codeword to determine whether the weight is within a predetermined range. This predetermined range may correspond to the range of syndrome weights that have entries in the look-up table. Since the look-up table is typically produced offline, as shown in operations 901-904 of FIG. 9A, the predetermined range used at operation 920 may be hard-wired or hard-coded into the decoder. In other embodiments, the decoder may execute operation 920 by comparing the syndrome weight of the received codeword to the syndrome weights listed in the look-up table. If the codeword syndrome weight is not within the predetermined range or not found in the look-up table, then the responsible trapping set might not be stored in the look-up table and the decoder may abort and move on to the next received codeword.

On the other hand, if the codeword syndrome weight is found in the look-up table, then the decoder may determine at operation 921 if any trapping sets listed in the look-up table have the same mother code vector $y_m$ as that of syndrome pattern c. If at least one matching mother code vector is found in the look-up table, the decoder may proceed to operation 922. At operation 922, the decoder may calculate the quasi-cyclic shift difference $\Delta$ between the first check node of syndrome pattern c and the first check node of each trapping set listed in the look-up table whose row mother code vector is equal to $y_m$. At operation 923, the decoder may apply quasi-cyclic shifts of magnitude $\Delta$ to each trapping set listed in the look-up table for which a shift difference $\Delta$ was calculated at operation 922. The decoder may then compare the resulting shifted syndrome patterns to syndrome pattern c. If a shifted syndrome pattern is found to equal c, the shifted syndrome pattern may belong to the responsible trapping set, and the corresponding trapping set listed in the look-up table may be a member of the responsible trapping set class. At operation 924, the most likely responsible trapping set is selected and the magnitude $\Delta$ of the shift used to generate it is saved.

In some scenarios, multiple trapping sets may have shifted syndrome patterns equal to c. In these scenarios, the decoder may use a metric to choose one trapping set over the others as the most likely responsible trapping set. For example, the decoder may sum the magnitudes of the error bit LLRs for each trapping set and chose the trapping set with the smallest sum as the most likely responsible trapping set. The decoder may also compare the LLR magnitude of each bit in the trapping sets to a fixed threshold and chose the trapping set with the greatest number of bits with LLRs lower than the threshold. Other metrics may also be used to choose between trapping sets with identical syndrome patterns.

Referring back to FIG. 9A, if the decoder succeeds in selecting a responsible trapping set and saving its corresponding shift magnitude $\Delta$ at operation 908, the decoder may retrieve from the look-up table the error pattern stored in connection with the responsible trapping set class. The decoder may then apply a quasi-cyclic shift of magnitude $\Delta$ to retrieved error pattern to produce the error pattern b of the responsible trapping set (operation 909). Error pattern b lists the locations of the erroneous bits in the received codeword. At operation 910, the decoder inverts the erroneous bits identified by error pattern b, thereby producing the corrected codeword.

Figure 10:
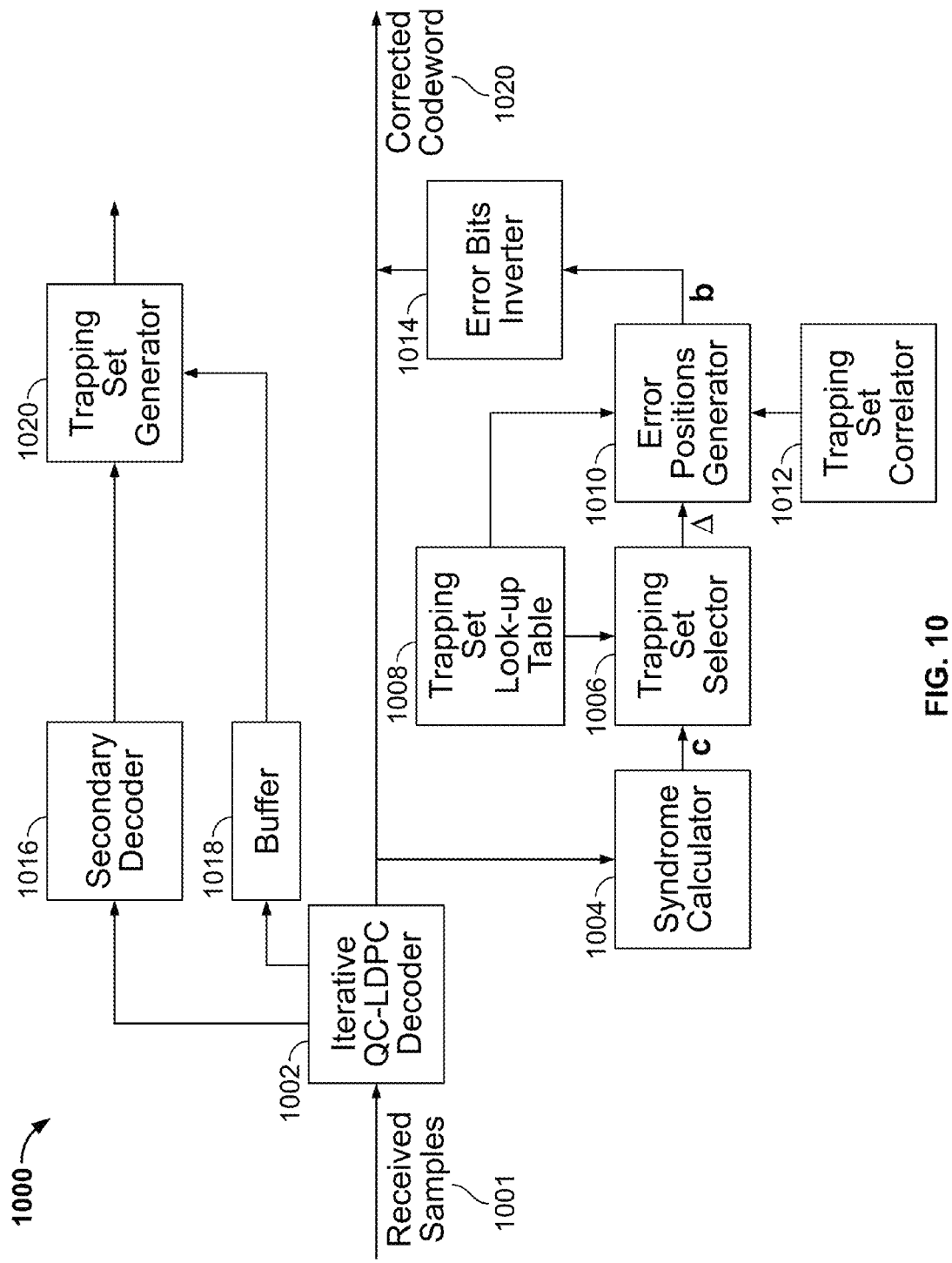
FIG. 10 is a modified high level block diagram of an error floor reducing decoding system, according to an illustrative embodiment.

FIG. 10 is a modified high level block diagram of an error floor reducing decoding system, according to an illustrative embodiment. Decoder 1000 may include iterative QC-LDPC decoder 1002, syndrome calculator 1004, trapping set selector 1006, trapping set look-up table 1008, error positions generator 1010, trapping set correlator 1012, and error bits inverter 1014. Each of the components listed above may be substantially identical to iterative QC-LDPC decoder 602, syndrome calculator 604, trapping set selector 606, trapping set look-up table 608, error positions generator 610, trapping set correlator 612, and error bits inverter 614 of FIG. 6 respectively. Decoder 1000 may additionally include secondary decoder 1016, buffer 1018, and trapping set generator 1020.

As described in connection with FIG. 6 above, in some scenarios trapping set selector 1006 may not be able to find a responsible trapping set using table 700. This may be because the responsible trapping set class is not represented in table 700, e.g., because of varying system properties, dominant trapping sets may vary from system to system. In such scenarios, decoder 1000 may attempt to decode the received codeword using secondary decoder 1016. If secondary decoder 1016 fails to decode the received codeword then decoder 1000 may start processing the next received codeword.

Secondary decoder 1016 may take received samples 601 as input from iterative QC-LDPC decoder 1002 after iterative QC-LDPC decoder 1002 has calculated a hard-decision ĝ for the received codeword. Hard-decision ĝ may be transmitted by iterative QC-LDPC decoder 1002 to buffer 1018 and stored in buffer 1018. Hard-decision ĝ may correspond to a decoding failure with low syndrome weight. Secondary decoder 1016 may be operable to decode the received codeword using one of a variety of decoding algorithms.

Secondary decoder 1016 may employ a decoding algorithm with a varying number of global outer or inner decoding iterations. For example, the inner decoding iterations may be performed using LDPC iterative decoding while the outer decoding iterations may be performed using SOVA-LDPC iterative decoding. In some embodiments, the scaling of an LDPC iterative decoding parameter may be varied in the inner decoding iterations. Secondary decoder 1016 may alternatively employ other decoding algorithms for decoding the received codeword. For example, secondary decoder 1016 may utilize iterative turbo decoding, decoding using a modified LLR input to the LDPC decoder or a modified input to the SOVA detector, or iterative decoding using modified non-linear parameters of a Viterbi decoder.

If secondary decoder 1016 fails to decode the received codeword then decoder 1000 may start processing the next received codeword. Otherwise, upon successfully decoding the received codeword, secondary decoder 1016 may output a valid hard-decision (or a valid codeword) g. When g is a valid hard-decision the syndrome of g is zero. Trapping set generator 1020 may receive the valid hard-decision g from secondary decoder 1016 and hard-decision ĝ, corresponding to the decoding failure with low syndrome weight, from buffer 1018. Trapping set generator 1020 may compute error vector e=g−ĝ. Error vector e may be a near-codeword error, i.e., e may have a small hamming distance because of low syndrome weight.

Trapping set generator 1020 may calculate the syndrome of e, which may be identical to the syndrome of hard-decision ĝ because the syndrome of valid hard-decision g is zero. Trapping set generator 1020 may convert the calculated syndrome of e into a format suitable for addition to table 700. For example, trapping set generator 1020 may compute the error pattern corresponding to error vector e and the syndrome pattern corresponding to the syndrome of e, and store the resulting error and syndrome patterns in table 700.

Figure 11:
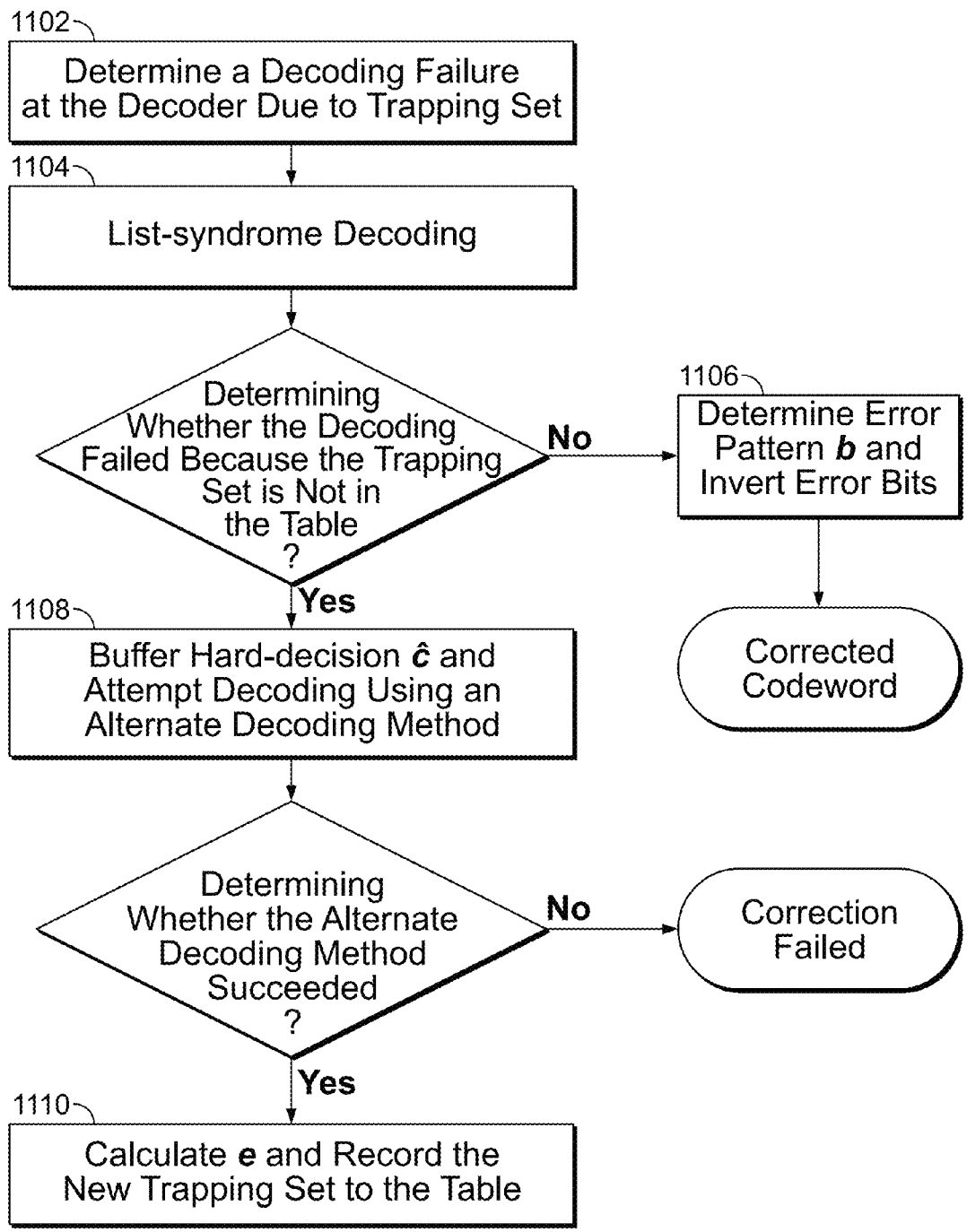
FIG. 11 is a flowchart illustrating the addition of a responsible trapping set class to the look-up table, according to an illustrative embodiment.

FIG. 11 is a flowchart illustrating the addition of a responsible trapping set class to the look-up table, according to an illustrative embodiment. At operation 1102, a standard iterative QC-LDPC decoding algorithm is applied to a received codeword. For example, operation 1102 may be performed by decoder 1002 of FIG. 10. If the iterative decoding at operation 1102 does not converge to a valid codeword after a decoder-imposed maximum number of iterations have been performed, then decoder 1002 computes a hard-decision and the decoding process proceeds to operation 1104, where list-syndrome decoding is performed.

At operation 1104, a syndrome pattern corresponding to the received codeword is calculated. The calculation of the syndrome pattern may be performed in the manner described above in connection with FIG. 6. If the syndrome pattern is found in the look-up table and the corresponding responsible trapping set is identified, then the decoding process proceeds to operation 1106. The identification of the responsible trapping set may be performed in the manner described above in connection with FIGS. 6 and 9A. At operation 1106, the decoder may determine error pattern b of the responsible trapping set and invert the error bits identified by error pattern b to produce a corrected codeword. If the syndrome pattern or corresponding syndrome weight is not found in the look-up table, then the trapping set responsible for the syndrome pattern might not be stored in the look-up table and the decoding process proceeds to operation 1108.

At operation 1108, the hard-decision computed by decoder 1002 may be transmitted to buffer 1018 of FIG. 10 and stored in buffer 1018. The syndrome pattern calculated at operation 1104 may also be stored in buffer 1018. The decoding process attempts to decode the received codeword using an alternative decoding algorithm as described above in connection with FIG. 10. For example, at operation 1108, decoding may be performed by secondary decoder 1016 of FIG. 10. If the secondary decoder is unable to output a valid codeword, then the decoding process is aborted and the decoding process continues on to decode the next received codeword. If the secondary decoder is able to output a valid codeword, then the decoding process proceeds to operation 1110.

At operation 1110, trapping set generator 1020 of FIG. 10 may receive the valid codeword (or valid hard-decision) from secondary decoder 1016 and the hard-decision from buffer 1018. Trapping set generator 1020 may compute an error vector based on the received hard-decisions and generate an error pattern and a syndrome pattern characterizing the trapping set responsible for the decoding failure at operation 1102. The generation of the error and syndrome pattern may occur in the manner described above in connection with FIG. 10. Trapping set generator 1020 may add the generated responsible trapping set information to the look-up table.

In some embodiments, the decoding algorithm may additionally consider variations of the dominant trapping sets stored in table 700. As described previously in connection with FIG. 7, the success rate of decoder 600 of FIG. 6 is dependent on the size of table 700. However, larger tables require more resources. In some instances, therefore, it may be beneficial to consider possible variations of dominant trapping sets stored in table 700.

Figure 12:
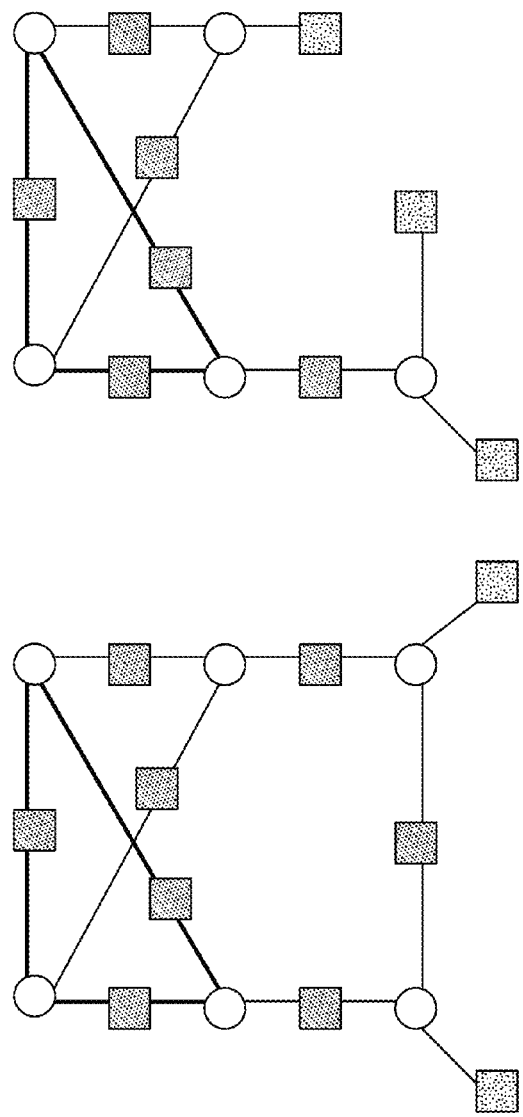
FIG. 12 shows illustrative short-cycle trapping sets.
Figure 12:
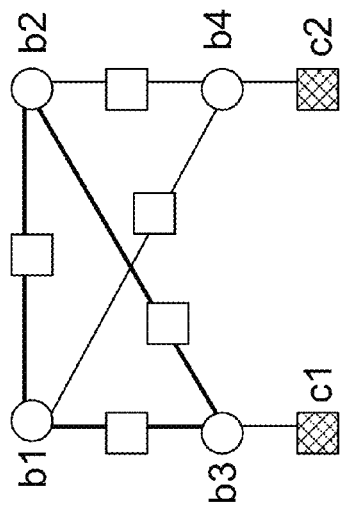

In general, finding all possible variations of a trapping set may be challenging because of computational cost. However, a subset of the variations of a trapping set—referred to as short-cycle trapping sets—may be determined by searching the tanner graph of the parity check matrix H, for example, of FIG. 2B. FIG. 12 shows illustrative short-cycle trapping sets. As shown in FIG. 12, the (6,2) trapping set, the (5,3) trapping set, and the (4,2) trapping set all have overlapping short cycles (indicated in bold black lines). A short cycle may be defined as any cycle (i.e., consecutive sequence) of nodes on the tanner graph in which the number of participating nodes may be below a pre-determined threshold.

A table containing short-cycles may be stored in conjunction with table 700 of FIG. 7. For example, the table of short-cycles may store dominant trapping sets, as contained in table 700, and corresponding short-cycles associated with each dominant trapping set. For each short-cycle stored in the table of short-cycles, the mother code index $x_m$ or $y_m$ and the circulant index $x_c$ or $y_c$ may be stored for each bit node and unsatisfied check node that may be part of the short-cycle. For example, as shown in the bottom right graph of FIG. 12, a (4,2) trapping set may include a short-cycle as indicated by the bold black line. Accordingly, for this short-cycle, indices $x_m$ or $y_m$ and $x_c$ or $y_c$ corresponding to bit nodes b1, b2, b3, and b4 and unsatisfied check nodes c1 and c2 may be stored in the table of short-cycles. In some implementations, for each dominant trapping set, the table of short-cycles may store only the most significant short-cycles associated with each dominant trapping set. The most significant short-cycles may correspond to short-cycles most likely to decoding errors.

Figure 13:
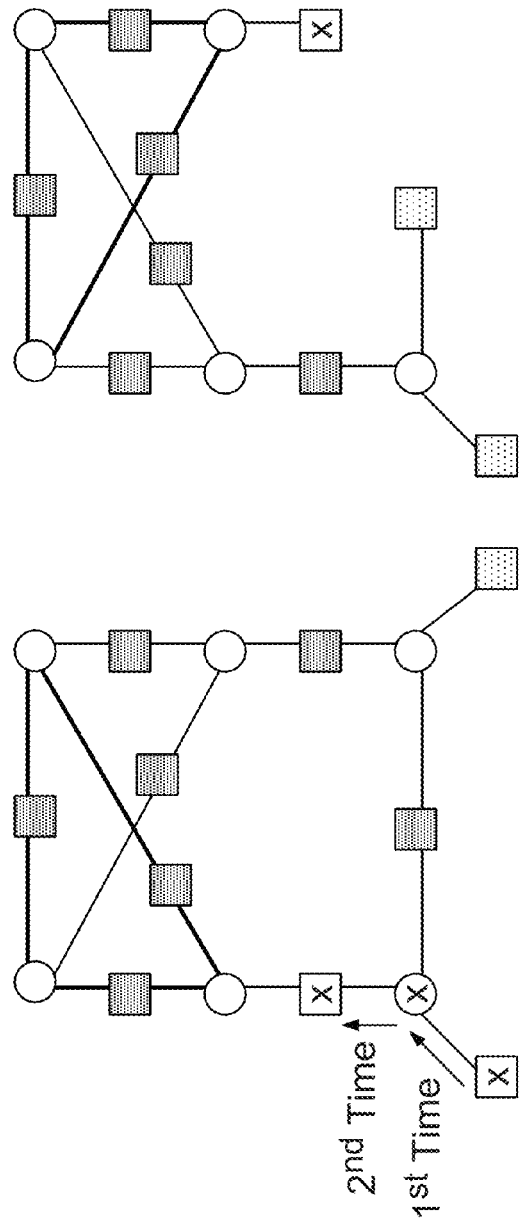
FIG. 13 shows illustrative short-cycle searching.

FIG. 13 shows illustrative short-cycle searching, i.e., how a short-cycle may be identified in a trapping set. In the case that a decoder—for example, iterative decoder 602 of FIG. 6—fails to decode the codeword, syndrome calculator 604 may calculate the syndrome pattern corresponding to received samples 601. As described above in connection with FIG. 2 and FIG. 6, when the decoder fails to generate a valid codeword, the syndrome pattern calculated by syndrome calculator 604 may contain unsatisfied check nodes. Trapping set selector 606 may determine the trapping set that most likely caused the decoder to fail to decode received samples 601. Circuitry for determining short-cycles (not shown) may then determine short-cycles associated with the unsatisfied check nodes.

The circuitry for determining short-cycles may begin searching for short-cycles by considering any one of the unsatisfied check nodes associated with the determined trapping set. For example, as shown in FIG. 13 for the (4,2) trapping set, the circuitry may begin the short-cycle search by considering the unsatisfied check node marked with 'X.' As described above in connection with FIG. 5, an unsatisfied check node may be expressed in terms of the mother code index $x_m$ or $y_m$ and circulant index $x_c$ or $y_c$. Circuitry for determining short-cycles may accordingly determine the mother code indices $x_m$ or $y_m$ of the unsatisfied check node being considered and of all bit nodes that are connected to the unsatisfied check node being considered.

The circuitry for determining short-cycles may compare the determined mother code indices to mother code indices corresponding to short-cycles stored in the table of short-cycles. If no match is found, the circuitry for determining short-cycles may consider another unsatisfied check node associated with the determined trapping set. If no other unsatisfied check nodes associated with the determined trapping set remain to be considered, the circuitry for determining short-cycles may abort the operation and the decoder may start processing the next received samples.

If at least one matching mother code index is found in the table of short-cycles, the circuitry for determining short-cycles may have identified a short-cycle. Once the circuitry for determining short-cycles has identified a short-cycle associated with the unsatisfied check node being considered, the circuitry may determine the shift difference $\Delta$, apply the shift difference $\Delta$ to the bit nodes of the short-cycle, and perform decoding based on LLR biasing as described below.

FIG. 13 illustrates further examples of short-cycle searching in a (5,3) trapping set and a (6,2) trapping set. Short-cycle searching in the (5,3) trapping set may proceed in a manner similar to the process described above for the (4,2) trapping set.

In contrast, short-cycle searching for the (6,2) trapping set may require a two tier search before a short-cycle is located. In particular, as shown in FIG. 13, the circuitry for determining short-cycles may begin the first tier of the search by considering the unsatisfied check node marked with 'X.' The circuitry for determining short-cycles may determine the mother code indices $x_m$ or $y_m$ of the unsatisfied check node being considered and of the bit node that is connected to the unsatisfied check node being considered. If the mother code index of the bit node that is connected to the unsatisfied check node being considered, is not found in the table of short-cycles, the circuitry for determining short-cycles may proceed to the second tier of the search by considering the second unsatisfied check node marked with 'X.' The circuitry for determining short-cycles may then determine the mother code indices $x_m$ or $y_m$ of the second unsatisfied check node being considered and of all the bit nodes that are connected to the second unsatisfied check node being considered, following which the circuitry for determining short-cycles may compare the determined mother code indices to mother code indices corresponding to short-cycles stored in the table of short-cycles.

The process of decoding received codewords using short-cycle decoding may be a modified version of the decoding process described above in connection with FIG. 6. As described in greater detail below, upon identification of a short-cycle of a dominant trapping set, the iterative QC-LDPC decoder may be re-run using biased input LLR's.

In particular, the decoder of FIG. 6 may be configured to change some of the inputs to the iterative QC-LDPC decoder. The change in the inputs may effectively modify the received codeword and allow the iterative QC-LDPC decoder to decode the modified received codeword. To determine which bit positions of the received codeword to change, the decoder may select one of the unsatisfied checks associated with the determined syndrome pattern c and may then identify the bit positions in the received codeword associated with the selected unsatisfied check. The decoder may make a determination as to whether any of the identified bit positions are associated with any short-cycles of the trapping set responsible for the syndrome pattern c. The bit positions associated with short-cycles may be the ones that the decoder changes.

The decoder may make the determination as to whether any of the identified bit positions are associated with short-cycles of the trapping set responsible for the syndrome pattern c by first identifying short-cycles of the responsible trapping set. Because there may be many possible short-cycles, the decoder may restrict its search to the most adverse short-cycles to limit computational or resource overheads. The most adverse short-cycles may be short-cycles that may be most likely to cause decoding errors. In some embodiments, the search for short-cycles may be restricted using any other suitable metric. Once the decoder has identified the most adverse short-cycles, the decoder may make a determination as to whether any of the identified bit nodes are part of any of the identified short-cycles.

To change the inputs to the iterative QC-LDPC decoder corresponding to the identified bit positions, the decoder may set LLR inputs to predetermined values. The LLR inputs of the iterative QC-LDPC decoder may be LLR values corresponding to the identified bit positions of the received codeword. In some embodiments, the predetermined values may, for example, be a predetermined magnitude (e.g., a maximal magnitude, say 31) having either a positive or negative sign. Other suitable predetermined values may also be used. Setting LLR inputs to predetermined values in this manner may be referred to as biasing the LLR inputs. The decoder may then flip the sign of one of the bit positions of the hard-decision. The decoder may leave the remaining bit positions of the hard-decision unchanged. In some embodiments, the decoder may modify the LLR values corresponding to the remaining bit positions. By flipping the sign of a bit position, the decoder essentially operates with the assumption that this bit position was erroneous, and attempts to correct the error.

With the inputs to the iterative QC-LDPC decoder modified in this manner, the iterative QC-LDPC decoder may be directed to decode the modified received codeword, which may in some cases produce a valid codeword (depending, for example, on whether the bit position flipped was actually one of the erroneous bits). The decoder may direct the iterative QC-LDPC decoder to perform decoding several additional times, with different variations. For example, a sign of a different bit position may be flipped, signs of multiple bit positions may be flipped, and/or bit positions associated with a different unsatisfied check and/or short-cycle may be used. Additional details describing the process of decoding received codewords by biasing input LLR's of an iterative LDPC decoder are provided in commonly-assigned U.S. patent application Ser. No. 12/327,627, filed Dec. 3, 2008, which is hereby incorporated by reference its entirety.

Figure 14:
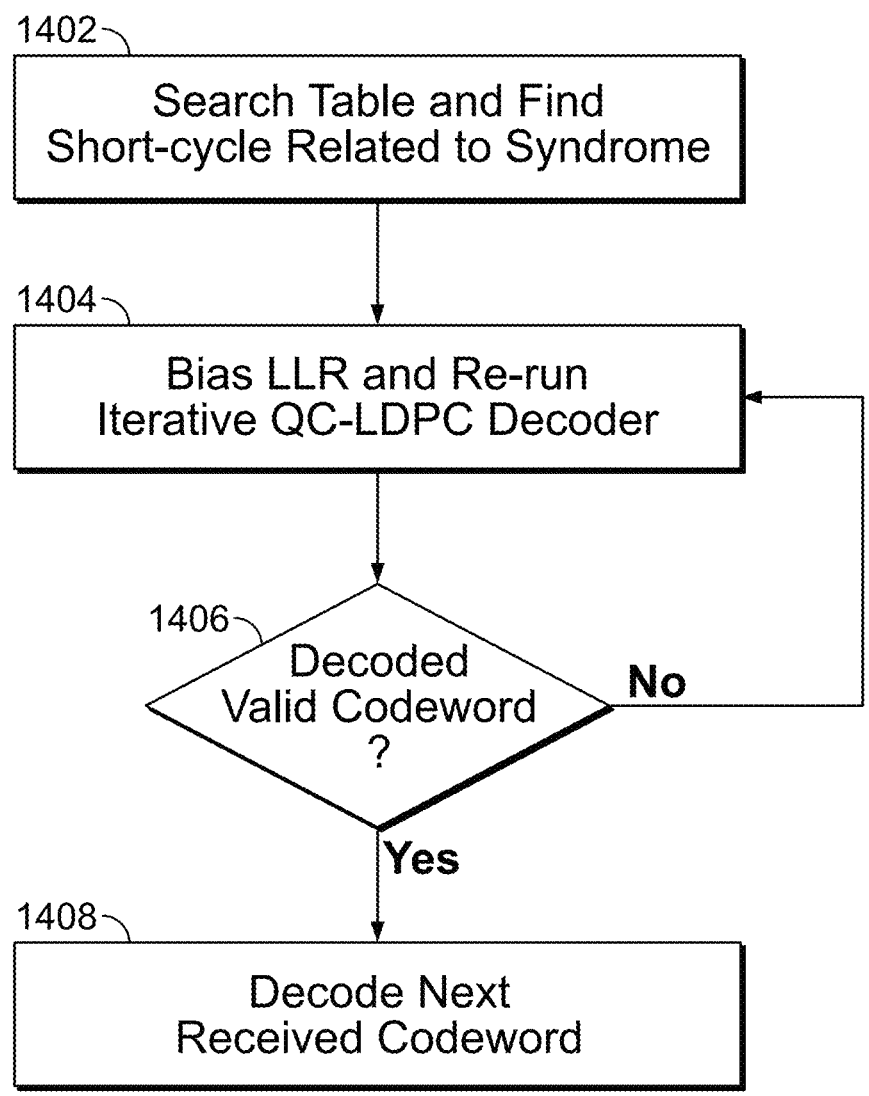
FIG. 14 is a flowchart illustrating short-cycle decoding, according to an illustrative embodiment.

FIG. 14 is a flowchart illustrating short-cycle decoding, according to an illustrative embodiment. Prior to operation 1402, the decoding process may perform operations 901-907 of FIG. 9A as described above in connection with FIG. 9A, i.e., the decoding process may have computed a codeword syndrome pattern c. At operation 1402, the decoding process may determine the responsible trapping set corresponding to the codeword syndrome pattern c by searching the look-up table. The decoder may make a determination as to whether any adverse short-cycles are associated with the responsible trapping set. If no adverse short-cycles are found than the decoding process may proceed to decoding the next received codeword, otherwise the decoding process may proceed to operation 1404.

At operation 1404, the decoding process may select one of the unsatisfied checks associated with the determined syndrome pattern c and may identify the bit positions in the received codeword associated with the selected unsatisfied check. The decoder may then make a determination as to whether any of the identified bit positions are associated with any short-cycles of the trapping set determined at operation 1402. The decoder may select of the identified bit positions and flip the sign of the selected bit position. The decoder may additionally bias the LLR value corresponding to the selected bit position. The decoder may bias the LLR inputs of the iterative QC-LDPC decoder as described above and may re-run the iterative QC-LDPC decoder using biased input LLR's. For example, the iterative QC-LDPC decoder may be iterative QC-LDPC decoder 602 of FIG. 6.

At operation 1406, the decoder may make a determination as to whether the iterative QC-LDPC decoder has successfully determined a valid codeword. If the iterative QC-LDPC decoder has not yielded a valid codeword, the decoding process may proceed back to operation 1404 where the decoder may flip a sign of a different bit position, flip signs of multiple bit positions, and/or select bit positions associated with a different unsatisfied check and/or short-cycle. Otherwise the decoding process may proceed to operation 1408 where the decoding process may begin decoding the next received codeword.

It should be understood that the flowcharts of FIGS. 9A, 9B, 11, and 14 are merely illustrative. Any of the operations in these processes may be omitted, modified, combined, and/or rearranged, and any additional operations may be performed, without departing from the scope of the disclosure.

The foregoing describes systems and methods for QC-LDPC decoding. Those skilled in the art will appreciate that the invention can be practiced by other than the described embodiments, which are presented for the purpose of illustration rather than of limitation.

What is claimed is:

1. A method for determining a trapping set class, the method comprising:
   determining a syndrome pattern of a received codeword when a first decoder fails to decode the received codeword;
   processing the received codeword using a second decoder when a trapping set class corresponding to the syndrome pattern is not found in a trapping set look-up table; and
   determining, based on the syndrome pattern and a hard decision generated by the second decoder, a responsible trapping set.

2. The method of claim 1 further comprising adding the responsible trapping set and the syndrome pattern to the trapping set look-up table, wherein the trapping set look-up table stores a respective syndrome pattern for each of a plurality of trapping sets.

3. The method of claim 1 further comprising in response to finding a first trapping set corresponding to the syndrome pattern in the trapping set look-up table, updating a failure frequency of the first trapping set.

4. The method of claim 2 further comprising:
   sorting the plurality of trapping sets stored in the trapping set look-up table based on a failure frequency of each of the plurality of trapping sets.

5. A method for decoding a received codeword, the method comprising:
   determining a syndrome pattern of a received codeword when an iterative decoding algorithm fails to decode the received codeword;
   determining, based on the syndrome pattern, a short cycle, wherein the short cycle is a portion of a trapping set;
   modifying, based on the short cycle, the received codeword; and
   performing, on the modified received codeword, one or more additional iterations of the iterative decoding algorithm.

6. The method of claim 5, wherein the modified received codeword is a first modified received codeword, the method further comprising:

further modifying the first modified received codeword when the iterative decoding algorithm fails to decode the first modified received codeword to generate a second modified received codeword; and
   performing, on the second modified received codeword, one or more additional iterations of the iterative decoding algorithm.

7. The method of claim 5 further comprising:
   selecting an unsatisfied check of the syndrome pattern;
   identifying a first set of bits associated with the selected unsatisfied check; and
   identifying, from the first set of bits, a second set of bits comprising bits associated with the short cycle.

8. The method of claim 7, further comprising discarding bits in the first set of bits not associated with the short cycle.

9. The method of claim 7, wherein modifying the received codeword comprises:
   in response to identifying the second set of bits, selecting a first bit from the second set of bits;
   setting the first bit to a value; and
   setting a first log-likelihood ratio (LLR) value corresponding to the first bit to a first predetermined value.

10. The method of claim 9, wherein setting the first bit to the value comprises flipping a sign of the first bit.

11. The method of claim 9, wherein the first predetermined value is a maximum magnitude of the LLR value.

12. The method of claim 9 further comprising:
   selecting a second bit from the second set of bits;
   flipping a sign of the second bit; and
   setting a second log-likelihood ratio (LLR) value corresponding to the second bit to a second predetermined value.

13. A decoder comprising decoding circuitry configured to:
   determine a syndrome pattern of a received codeword in response to an iterative decoding algorithm failing to decode the received codeword;
   determine, based on the syndrome pattern, a short cycle, wherein the short cycle is a portion of a trapping set;
   modify, based on the short cycle, the received codeword; and
   perform, on the modified received codeword, one or more additional iterations of the iterative decoding algorithm.

14. The decoder of claim 13, wherein the modified received codeword is a first modified received codeword, the decoding circuitry is further configured to:
   further modify the first modified received codeword when the iterative decoding algorithm fails to decode the first modified received codeword to generate a second modified received codeword; and
   perform, on the second modified received codeword, one or more additional iterations of the iterative decoding algorithm.

15. The decoder of claim 13, wherein the decoding circuitry is further configured to:
   select an unsatisfied check of the syndrome pattern;
   identify a first set of bits associated with the selected unsatisfied check; and
   identify, from the first set of bits, a second set of bits comprising bits associated with the short cycle.

16. The decoder of claim 15, wherein the decoding circuitry is further configured to:
   discard bits in the first set of bits not associated with the short cycle.

17. The decoder of claim 15, wherein the decoding circuitry is configured to modify the received codeword by:

in response to identifying the second set of bits, selecting a first bit from the second set of bits;
setting the first bit to a value; and
setting a first log-likelihood ratio (LLR) value corresponding to the first bit to a first predetermined value.

18. The decoder of claim 17, wherein setting the first bit to the value comprises flipping a sign of the first bit.

19. The decoder of claim 17, wherein the first predetermined value is a maximum magnitude of the LLR value.

20. The decoder of claim 17, wherein the decoding circuitry is further configured to:
select a second bit from the second set of bits;
flip a sign of the second bit; and
set a second log-likelihood ratio (LLR) value corresponding to the second bit to a second predetermined value.

* * * * *